(12) United States Patent
Jeong et al.

(10) Patent No.: US 7,867,867 B2
(45) Date of Patent: Jan. 11, 2011

(54) METHODS OF MANUFACTURING SEMICONDUCTOR DEVICES

(75) Inventors: Yong-kuk Jeong, Gyeonggi-do (KR); Andrew-tae Kim, Gyeonggi-do (KR); Dong-suk Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1030 days.

(21) Appl. No.: 11/593,898

(22) Filed: Nov. 7, 2006

(65) Prior Publication Data

US 2007/0105297 A1   May 10, 2007

(30) Foreign Application Priority Data

Nov. 7, 2005   (KR) ...................... 10-2005-0106096
Aug. 4, 2006   (KR) ...................... 10-2006-0073912

(51) Int. Cl.
  *H01L 21/336*   (2006.01)
(52) U.S. Cl. ................................ 438/308; 257/E21.632
(58) Field of Classification Search ................. 438/199, 438/200, 308, 142, 197; 257/E27.046, E27.108, 257/E21.632
See application file for complete search history.

(56) References Cited

U.S. PATENT DOCUMENTS

2005/0138507 A1 * 6/2005 Kurokawa ................... 714/724
2005/0153526 A1   7/2005 Oyu et al.
2005/0263825 A1 * 12/2005 Frohberg et al. ............ 257/369

FOREIGN PATENT DOCUMENTS

| JP | 10-173075 A | 6/1998 |
|---|---|---|
| JP | 10-242114 | 9/1998 |
| JP | 2005-005633 A | 1/2005 |
| KR | 10-1998-0001918 | 1/1999 |
| KR | 10-2002-0045494 | 6/2002 |
| KR | 10-2004-0459686 | 11/2004 |
| TW | 473800 | 1/2002 |
| TW | 235458 | 7/2005 |
| TW | 237311 B | 8/2005 |

OTHER PUBLICATIONS

Translation of Preliminary Notice of First Office Action for corresponding Taiwanese Application No. 09514118 dated Jan. 5, 2010.

* cited by examiner

*Primary Examiner*—Brook Kebede
(74) *Attorney, Agent, or Firm*—Myers Bigel Sibley & Sajovec

(57) ABSTRACT

Methods of manufacturing a semiconductor device include forming an NMOS transistor on a semiconductor substrate, forming a first interlayer dielectric layer on the NMOS transistor, and dehydrogenating the first interlayer dielectric layer. Dehydrogenating the first interlayer dielectric layer may change a stress of the first interlayer dielectric layer. In particular, the first interlayer dielectric layer may have a tensile stress of 200 MPa or more after dehydrogenization. Semiconductor devices including dehydrogenated interlayer dielectric layers are also provided.

36 Claims, 18 Drawing Sheets

METHODS OF MANUFACTURING SEMICONDUCTOR DEVICES

CROSS REFERENCE TO RELATED APPLICATIONS

This application claims priority under 35 U.S.C. §119 from Korean Patent Application No. 10-2005-0106096 filed on Nov. 7, 2005, and from Korean Patent Application No. 10-2006-0073912 filed on Aug. 4, 2006, in the Korean Intellectual Property Office, the disclosures of which are incorporated herein in their entirety by reference.

FIELD OF THE INVENTION

The present invention relates to semiconductor devices and methods of manufacturing the same, and more particularly, to semiconductor devices having improved operational characteristics and methods of manufacturing the same.

BACKGROUND

In integrated circuits, discrete devices such as metal-oxide semiconductor (MOS) transistors are widely used as switching elements. Accordingly, high performance MOS transistors are desired to improve the characteristics of semiconductor devices.

Methods of improving the carrier mobility of transistors by providing a channel stress to a channel region have been researched to obtain a high performance MOS transistors. See, e.g., J. Welser et al "Strain dependence of the performance enhancement in strained-Si n-MOSFETs" IEDM Tech. Dig. 1994, p. 373 and K. Rim et al "Enhanced hole mobilities in surface channel strained-Si p-MOSFETS" IEDM Tech. Dig. 1995, p. 517.

A tensile stress may be provided to a channel region of an NMOS transistor to improve electron mobility. Methods such as implanting carbon ions into source and drain regions of an NMOS transistor or forming a liner layer having a tensile stress on an NMOS transistor may be used to improve the electron mobility of NMOS transistors. In contrast, a compressive stress may be provided to a channel region of a PMOS transistor to improve the hole mobility thereof. Methods such as implanting germanium ions into source and drain regions of a PMOS transistor or forming a liner layer having a compressive stress on a PMOS transistor may be used to improve the hole mobility of PMOS transistors.

SUMMARY

Some embodiments of the invention provide methods of manufacturing a semiconductor device, including forming an NMOS transistor on a substrate, forming a first interlayer dielectric layer on the NMOS transistor, and dehydrogenating the first interlayer dielectric layer. Dehydrogenating the first interlayer dielectric layer may change a stress of the first interlayer dielectric layer. The first interlayer dielectric layer may have a tensile stress of 200 MPa or more after dehydrogenization.

Dehydrogenating the first interlayer dielectric layer may include performing a plasma treatment, a UV treatment, and/or a thermal treatment on the first interlayer dielectric layer in a dehydrogenation gas atmosphere. The dehydrogenation gas may include $N_2$, $O_2$, $O_3$, $N_2O$, $H_2$, and/or $D_2$. The first interlayer dielectric layer may include $O_3$-TEOS, USG, PSG, BSG, BPSG, FSG, SOG, and/or TOSZ.

The methods may further include forming contacts connected to the NMOS transistor in the first interlayer dielectric layer after forming the first interlayer dielectric layer.

The methods may further include forming a second interlayer dielectric layer on the first interlayer dielectric layer after dehydrogenating the first interlayer dielectric layer. The second interlayer dielectric layer may have a stress smaller than a stress of the first interlayer dielectric layer after dehydrogenating the first interlayer dielectric layer.

The methods may further include forming a capping layer on the first interlayer dielectric layer after dehydrogenating the first interlayer dielectric layer. The capping layer may obstruct or hinder moisture and/or external ions from penetrating into the first interlayer dielectric layer. The capping layer may be formed in an in-situ process after dehydrogenating the first interlayer dielectric layer.

The methods may further include forming a liner layer having a tensile stress on the NMOS transistor before forming the first interlayer dielectric layer.

The NMOS transistor may include a gate dielectric layer and a gate electrode. The total thickness of the gate dielectric layer, the gate electrode, and the liner layer of the NMOS transistor may be represented by t1 and the total thickness of the liner layer and the first interlayer dielectric layer is represented by t2, wherein $t2/t1 \geq 1.14$.

The methods may further include, after dehydrogenating the first interlayer dielectric layer, forming an additional interlayer dielectric layer having a stress on the first interlayer dielectric layer, and dehydrogenating the additional interlayer dielectric layer, Forming the additional interlayer dielectric layer and dehydrogenating the additional interlayer dielectric layer may be repeated one or more times.

Dehydrogenating the additional interlayer dielectric layer may include performing a plasma treatment, a UV treatment, and/or a thermal treatment on the additional interlayer dielectric layer in a dehydrogenation gas atmosphere.

The methods may further include forming a liner layer having a tensile stress on the NMOS transistor before forming the first interlayer dielectric layer.

The NMOS transistor may include a gate dielectric layer and a gate electrode. A total thickness of the gate dielectric layer, the gate electrode, and the liner layer of the NMOS transistor may be represented by t1 and a total thickness of the liner layer, the dehydrogenated first interlayer dielectric layer, and the dehydrogenated additional interlayer dielectric layer may be represented by t3, wherein $t3/t1 \geq 1.14$.

Forming the NMOS transistor on the semiconductor substrate may include forming the NMOS transistor and a PMOS transistor on the semiconductor substrate, and forming the first interlayer dielectric layer on the NMOS transistor may include forming the first interlayer dielectric layer on the NMOS transistor and on the PMOS transistor.

The methods may further include implanting germanium and/or nitrogen ions into a portion of the first interlayer dielectric layer formed on the PMOS transistor after dehydrogenating the first interlayer dielectric layer.

The methods may further include forming a mask pattern on a portion of the first interlayer dielectric layer formed on the PMOS transistor before dehydrogenating the first interlayer dielectric layer.

Methods of manufacturing a semiconductor device according to further embodiments of the invention include forming an NMOS transistor on a semiconductor substrate, forming a first interlayer dielectric layer, which may include an $O_3$-TEOS layer having a tensile stress, on the NMOS transistor, and dehydrogenating the first interlayer dielectric layer.

A semiconductor device according to some embodiments of the invention includes an NMOS transistor including a gate dielectric layer and a gate electrode on a substrate, a liner layer having a predetermined tensile stress on the NMOS transistor, and a dehydrogenated first interlayer dielectric layer on the liner layer. The dehydrogenated first interlayer dielectric layer has a tensile stress that is increased due to dehydrogenation thereof. The total thickness of the gate dielectric layer, the gate electrode, and the liner layer of the NMOS transistor may be represented by t1 and the total thickness of the liner layer and the dehydrogenated first interlayer dielectric layer may be represented by t2, wherein t2/t1≧1.14.

The device may further include contacts connected to the NMOS transistor in the dehydrogenated first interlayer dielectric layer.

The dehydrogenated first interlayer dielectric layer may be formed by a plasma treatment, a UV treatment, and/or a thermal treatment in a dehydrogenation gas atmosphere. The device may further include a second interlayer dielectric layer on the dehydrogenated first interlayer dielectric layer. The second interlayer dielectric layer may have a tensile stress smaller than the tensile stress of the dehydrogenated first interlayer dielectric layer.

The device may further include a capping layer on the dehydrogenated first interlayer dielectric layer. The capping layer may be configured to obstruct or hinder moisture and/or external ions from penetrating into the dehydrogenated first interlayer dielectric layer. The capping layer may be an in-situ capping layer.

The device may further include a dehydrogenated additional interlayer dielectric layer on the dehydrogenated first interlayer dielectric layer. The dehydrogenated additional interlayer dielectric layer may have a tensile stress that is increased due to dehydrogenation of the dehydrogenated additional interlayer dielectric layer. The total thickness of the liner layer, the dehydrogenated first interlayer dielectric layer, and the dehydrogenated additional interlayer dielectric layer may be represented by t3, where t3/t1≧1.14.

A semiconductor device according to further embodiments of the invention includes an NMOS transistor on a semiconductor substrate, and a first interlayer dielectric layer on the NMOS transistor. The first interlayer dielectric layer has a tensile stress due to dehydrogenation of the first interlayer dielectric layer. The device further includes a second interlayer dielectric layer on the first interlayer dielectric layer. The second interlayer dielectric layer has a stress smaller than that of the first interlayer dielectric layer.

Still further embodiments of the invention provide a semiconductor device including an NMOS transistor and a PMOS transistor on a semiconductor substrate, and a first interlayer dielectric layer on the NMOS and PMOS transistors. The first interlayer dielectric layer may include nitrogen and/or germanium ions implanted into a portion of the first interlayer dielectric layer on the PMOS transistor.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DESCRIPTION OF THE PREFERRED EMBODIMENTS

Figure 1:
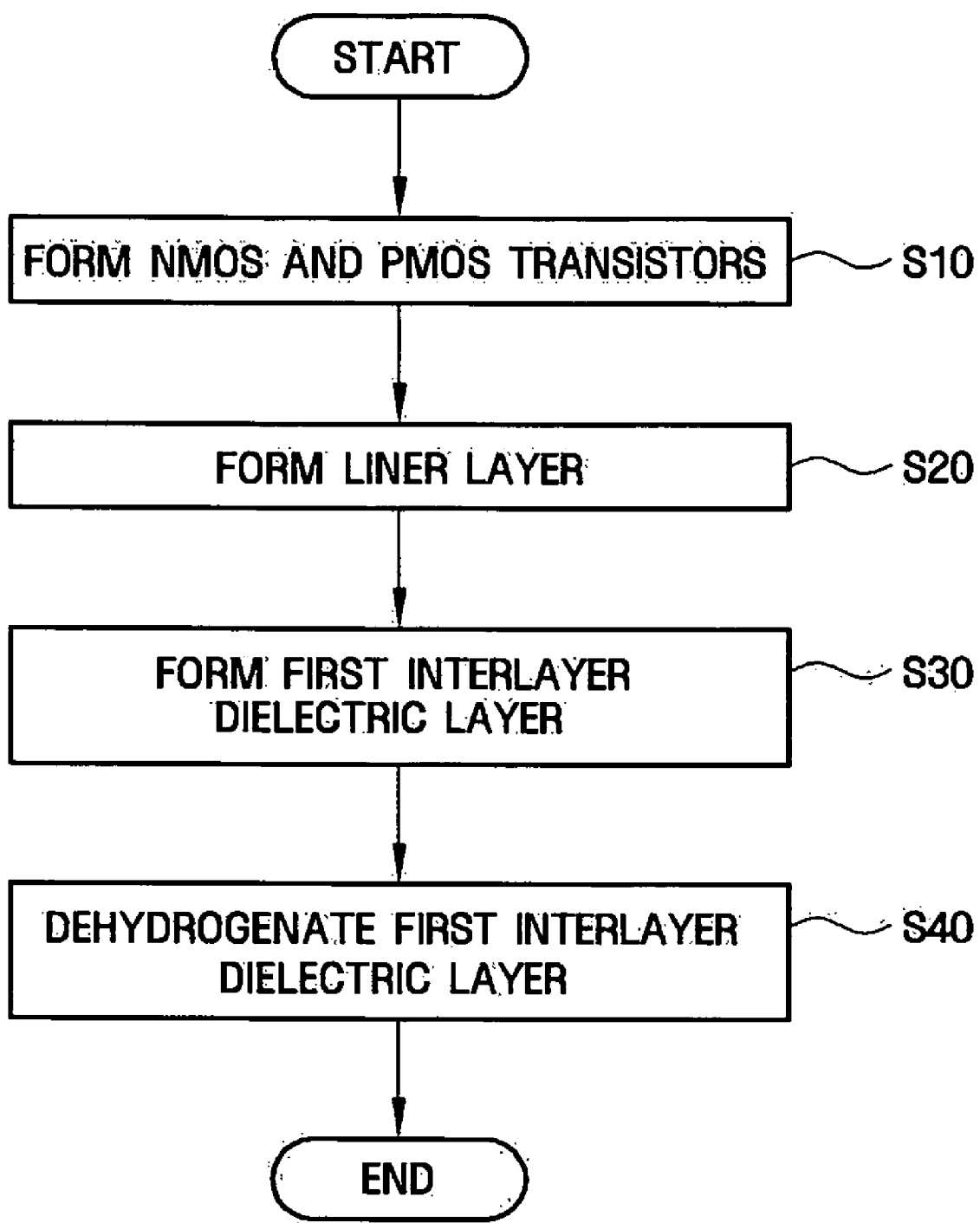
FIG. 1 is a flowchart illustrating methods of manufacturing a semiconductor device according to some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

It will be understood by those having skill in the art that as used herein, the term "MOS transistor" refers to any insulated gate field effect transistor, the gate of which comprises metal and/or nonmetal (such as polysilicon) and the insulator of which comprises oxide and/or other insulators (such as high dielectric constant insulators).

Some embodiments of the present invention are described below with reference to flowchart illustrations and/or block diagrams of methods according to embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

FIG. 1 is a flowchart illustrating methods of manufacturing a semiconductor device according to some embodiments of the invention, and FIGS. 2A to 2D are cross-sectional views illustrating methods of manufacturing a semiconductor device according to some embodiments of the invention.

Figure 2A:
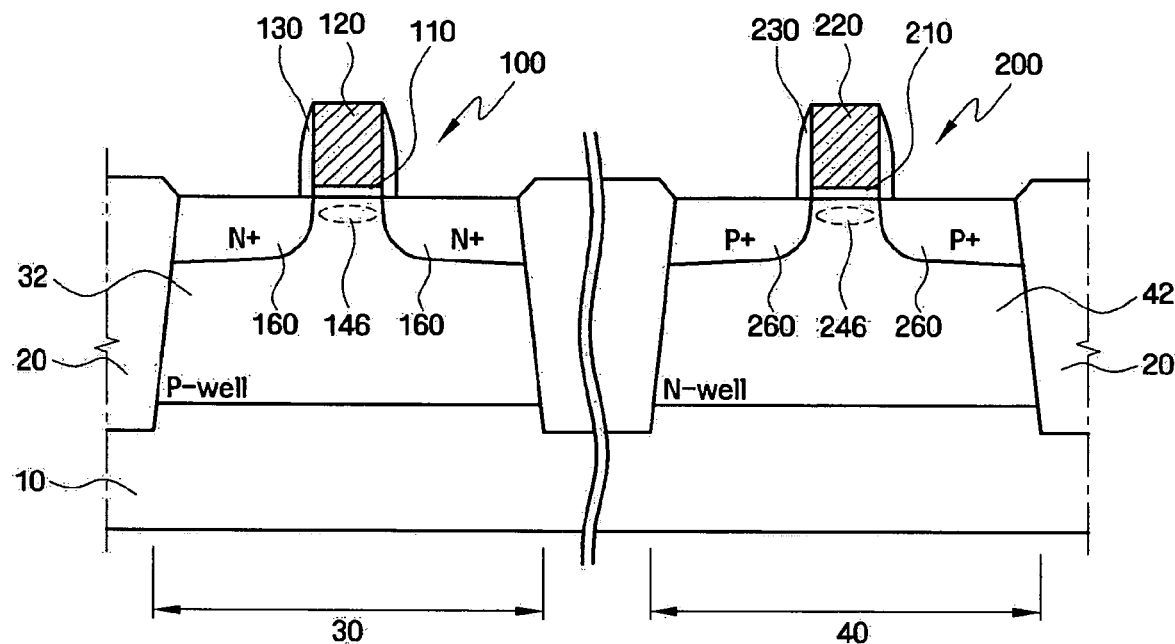
FIGS. 2A to 2D are cross-sectional views illustrating methods of manufacturing of a semiconductor device according to some embodiments of the invention.

Referring to FIGS. 1 and 2A, an NMOS transistor 100 and a PMOS transistor 200 are formed on a semiconductor substrate 10 (block S10).

Specifically, first, element isolation regions 20 are formed on the semiconductor substrate 10 so as to define first and second active regions 30 and 40. The substrate 10 may include a silicon substrate, SOI (Silicon On Insulator) substrate, gallium arsenide substrate, silicon germanium substrate, ceramic substrate, quartz substrate, display glass substrate, or the like. The element isolation regions 20 may include a FOX (Field OXide) formed using a STI (Shallow Trench Isolation) process and/or a LOCOS (LOCal Oxidation of Silicon) process.

Subsequently, P-type dopants may be implanted into the first region 30 to form a P-type well 32, and N-type dopants may be implanted into the second region 40 to form an N-type well 42.

A dielectric layer and a conductive layer are sequentially laminated on the first and second active regions 30 and 40 and then patterned so as to form first and second gate dielectric layers 110 and 210 and first and second gate electrodes 120 and 220. Each of the first and second gate dielectric layers 110 and 210 may include $SiO_2$, SiON, $Si_3N_4$, $Ge_xO_yN_z$, $Ge_xSi_yO_z$, a high dielectric material, and/or a laminated layer formed by laminating two or more of the these layers that are formed of $SiO_2$, SiON, $Si_3N_4$, $Ge_xO_yN_z$, $Ge_xSi_yO_z$, and/or the high dielectric material. In this case, $HfO_2$, $ZrO_2$, $Al_2O_3$, $Ta_2O_5$, hafnium silicate, zirconium silicate, or the like may be used as the high dielectric material.

The first gate electrode 120 is formed on the first gate dielectric layer 110, and the second gate electrode 220 is formed on the second gate dielectric layer 210. Furthermore, the first and second electrodes 120 and 220 may be formed of, for example, polysilicon, polysilicon into which dopant ions are implanted, and/or a metal having a resistance lower than that of the polysilicon. Although not shown in the drawings, metal and/or metal silicide may be further formed on the polysilicon to possibly provide improved operational characteristics of the first and second gate electrodes 120 and 220.

Subsequently, spacers 130 and 230 are formed. For example, dielectric layers used as spacers are sequentially formed on the entire surface of the semiconductor substrate 10 including the first and second electrodes 120 and 220, and the spacers 130 and 230 are formed on the sidewalls of the first and second electrodes 120 and 220, respectively, by using a blanket etch such as an etch-back.

After formation of the spacers 130, 230, N-type source and drain regions 160 and P-type source and drain regions 260 may be formed, for example, via ion implantation.

Specifically, the second active region 40 may be shielded by a mask. Then, while the first gate electrode 120 and the spacer 130 of the NMOS transistor 100 are used as ion implantation masks, N-type dopants, such as arsenic (As), may be implanted into the substrate 10. The first active region 30 is then shielded by a mask, and, while the second gate electrode 220 and the spacer 230 of the PMOS transistor 200 are used as ion implantation masks, P-type dopants, such as boron (B), may be implanted into the substrate 10. In this case, halo ions may be selectively implanted into each of the first and second active regions 30 and 40. Halo ions are ions that are implanted which may enhance the concentration in the active regions of the semiconductor substrate after the formation of the gate electrodes and to possibly reduce the likelihood of punch-through occurring as the length of a channel region is shortened. Ions having a conductivity type opposite to the conductivity type of ions that form the source and drain regions are usually used as the halo ions. Accordingly, P-type dopants, such as boron, may be implanted as halo implants into the first active region 30, and N-type dopants, such as arsenic, may be implanted as halo implants into the second active region 40.

The source and drain regions 160 and 260 of the NMOS and the PMOS transistors 100 and 200 according to some embodiments of the invention may be modified in various ways, and may be modified to have, for example, an LDD (Lightly Diffused Drain) structure, a DDD (Double Diffused Drain) structure, an MIDDD (Mask Islanded Double Diffused Drain) structure, an MLDD (Mask LDD) structure, an LDMOS (Lateral Double-diffused MOS) structure, or the like.

Subsequently, a thermal process may performed, for example, to activate implanted ions and/or to repair lattice damage. An RTP (Rapid Temperature Process) or LSA (LaSer Annealing) may be used as the thermal process.

Figure 2B:
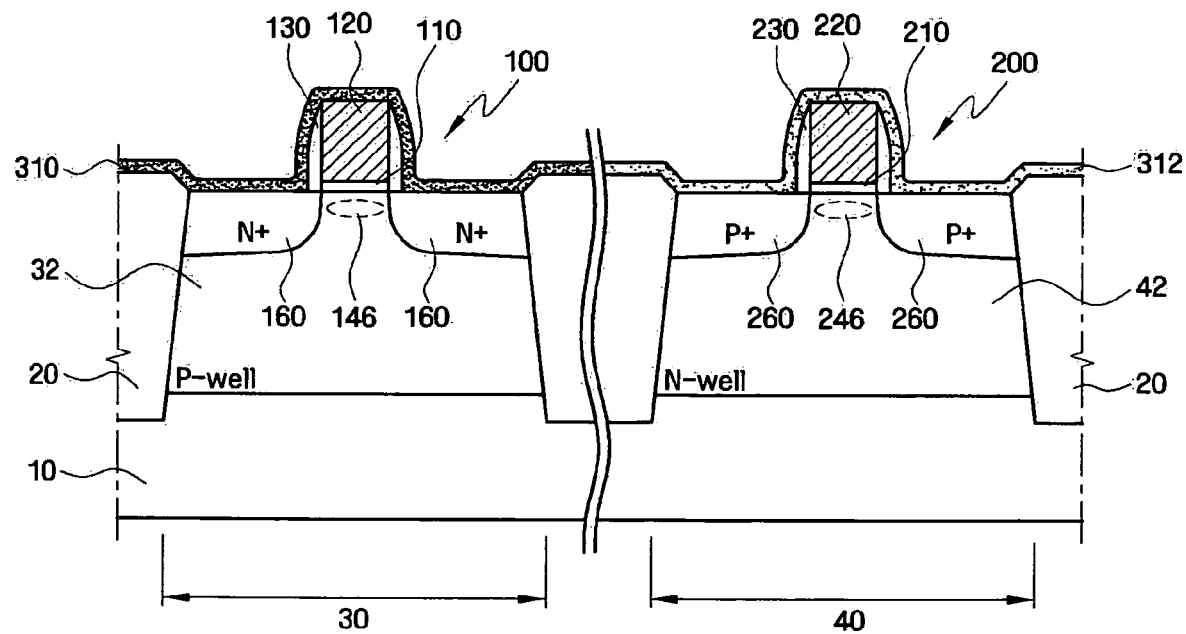

Referring to FIGS. 1 and 2B, first and second liner layers 310 and 312 are formed on the NMOS and PMOS transistors 100 and 200, respectively (block S20).

Specifically, each of the first and second liner layers 310 and 312 may include, for example, a SiN layer, a SiON layer, an LPCVD (Low Pressure Chemical Vapor Deposition) oxide layer, an ALD (Atomic Layer Deposition) oxide layer, an SOG (Spin On Glass) layer and/or a laminated layer formed by laminating two or more of these layers, and may have a thickness of about 50 Å to about 2000 Å.

The first and second liner layers 310 and 312 may serve as antireflection layers and/or as etch stop layers in the processes for manufacturing the semiconductor device. In addition, since the first and second liner layers 310 and 312 may be formed on the NMOS and the PMOS transistors 100 and 200 to have predetermined stresses, the operational characteristics of the NMOS and PMOS transistors 100 and 200 may be improved.

Specifically, the first liner layer 310, which may have a tensile stress, may be formed on the NMOS transistor 100, and the second liner layer 312, which may have a compressive stress, may be formed on the PMOS transistor 200. For example, when the first and second liner layers 310 and 312 are formed of SiN, the type of stress (i.e. tensile or compressive stress) that occurs in the layers may depend on the ratio of N—H bonding to Si—H bonding in the layers. That is, if the ratio of N—H bonding to Si—H bonding in a SiN layer is in the range of about 1 to 5, tensile stress may occur in the SiN layer. If the ratio of N—H bonding to Si—H bonding in a SiN layer is in the range of about 5 to 20, a compressive stress may occur in the SiN layer. Accordingly, a SiN layer having a ratio of N—H bonding to Si—H bonding in the range of about 1 to 5 may be used as the first liner layer 310 in embodiments of the invention. Further, a SiN layer having a ratio of N—H bonding to Si—H bonding in the range of about 5 to 20 may be used as the second liner layer 312.

Methods of forming the first and second liner layers 310, 312 are not limited to the methods described above. For example, after a single liner layer having a predetermined stress is formed on the NMOS and PMOS transistors, germanium and/or nitrogen ions may be implanted into the portion of the liner layer formed on the PMOS transistor so as to reduce the tensile stress therein.

Further, a process for implanting the germanium and/or nitrogen ions into the liner layer formed on the PMOS transistor may not be performed separately as described above. In some embodiments, the ions may be simultaneously implanted into the liner layer and a first interlayer dielectric layer in a process described below in connection with FIG. 6A, that is, in a process for implanting germanium and/or nitrogen ions into the first interlayer dielectric layer (layer 320 in FIG. 6A).

In addition, if the tensile stress of the liner layer formed on the NMOS and the PMOS transistors does not cause the operational characteristic of the PMOS transistor to deteriorate significantly, a separate process for implanting ions into the liner layer above the PMOS transistor may be omitted.

Figure 2C:
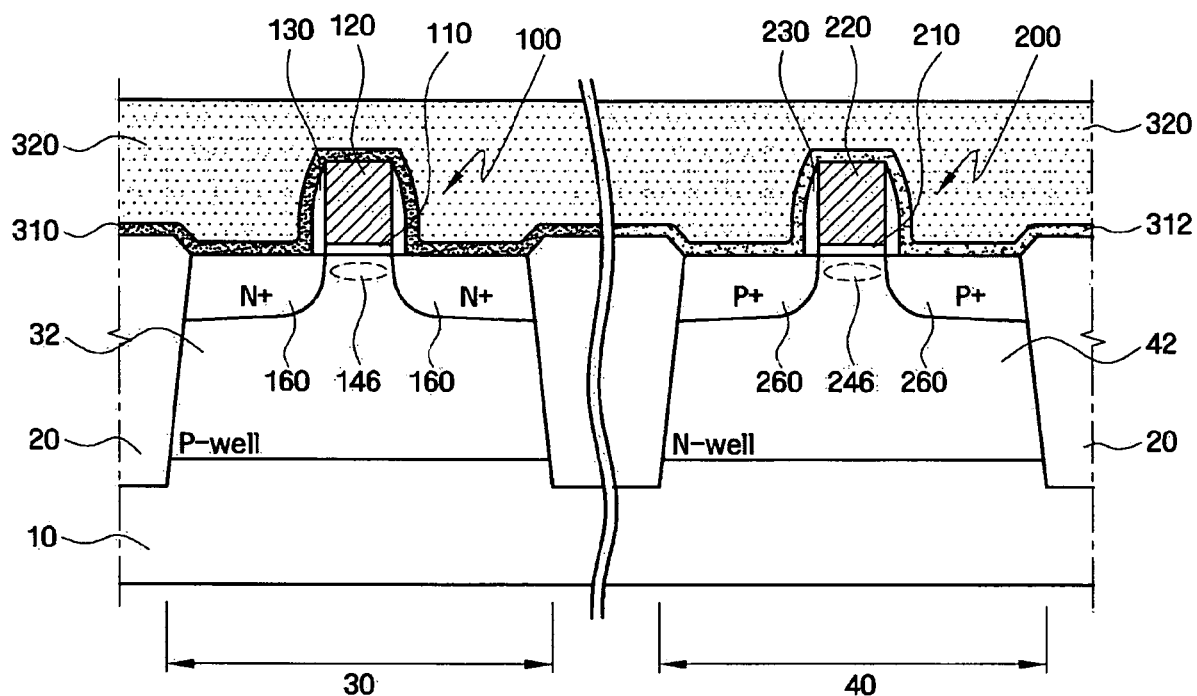

Referring to FIGS. 1 and 2C, a first interlayer dielectric (ILD) layer 320, which has a predetermined stress, is formed on the first and second liner layers 310 and 312 (block S30). Although not shown, the first interlayer dielectric layer 320 may include contacts used to connect the NMOS and PMOS transistors 100 and 200, which are formed on the semiconductor substrate 10, with metal wires. Therefore, the interlayer dielectric layer may be distinguished from an intermetallic dielectric (IMD) layer used to insulate the metal wires.

Specifically, the first interlayer dielectric layer 320 may include $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene) and/or a combination thereof. In some embodiments of the invention, the first interlayer dielectric layer 320 may be formed of $O_3$-TEOS having a predetermined tensile stress. In such case, the first interlayer dielectric layer 320 may be formed using a CVD (Chemical Vapor Deposition) method, a spin coating method, or the like.

Subsequently, the first interlayer dielectric layer 320 may be selectively planarized so as to easily perform subsequent processes.

Figure 2D:
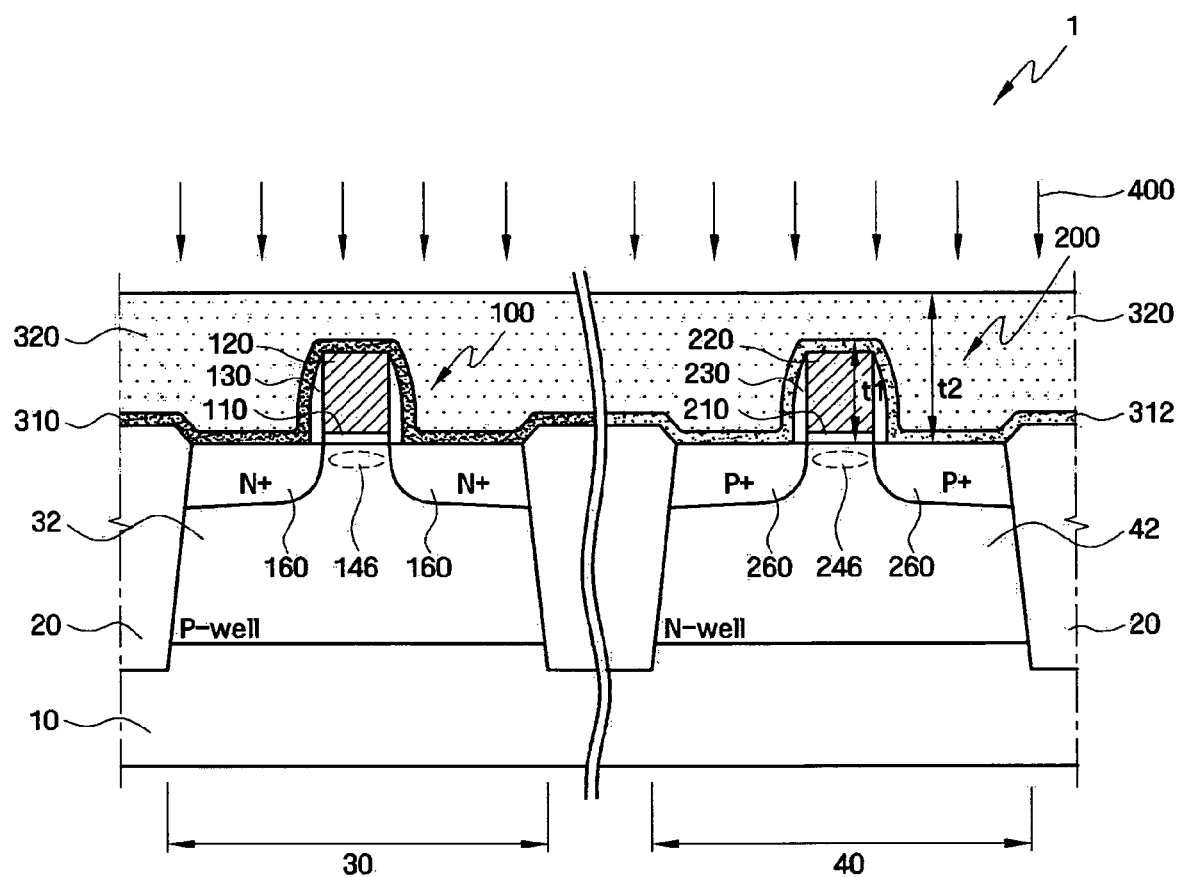

Referring to FIGS. 1 and 2D, the first interlayer dielectric layer 320 may be dehydrogenated so as to change the stress of the first interlayer dielectric layer 320 (block S40).

Specifically, when the first interlayer dielectric layer 320 is dehydrogenated (that is, when hydrogen ions are partially or fully removed from the first interlayer dielectric layer 320), voids may be formed in the dehydrogenated first interlayer dielectric layer 320, which may change the stress of the first interlayer dielectric layer 320.

The first interlayer dielectric layer 320 may be dehydrogenated, for example, by a plasma treatment, a UV treatment and/or a thermal treatment, which may be performed in a dehydrogenation gas atmosphere. Referring to FIG. 2D, a plasma treatment 400 may be performed on the first interlayer dielectric layer 320. The dehydrogenation gas may include $N_2$, $O_2$, $O_3$, $N_2O$, $H_2$, and/or $D_2$. For example, when a plasma treatment is performed while $O_3$ is used as the dehydrogenation gas (hereinafter, referred to as an '$O_3$ plasma treatment'), a process temperature may be set between room temperature and about 700° C., a process pressure may be set between about 10 mTorr and about 720 Torr, and an RF power may be set between about 20 W and about 10,000 W. An $N_2$ plasma treatment and/or an $N_2O$ plasma treatment may be performed under process conditions similar to the above-mentioned conditions. Furthermore, a process temperature in the $O_3$ thermal treatment may be set, for example, between about 200° C. and about 700° C. The dehydrogenation of the first interlayer dielectric layer 320 by a plasma treatment will be described in detail below with reference to a first example.

For example, if the first interlayer dielectric layer 320 is formed of $O_3$-TEOS and a plasma treatment, a UV treatment and/or a thermal treatment is performed in a dehydrogenation gas atmosphere so as to dehydrogenate the first interlayer dielectric layer 320, the Si—OH bonding may be decreased in the dehydrogenated first interlayer dielectric layer 320. If the concentration of the hydrogen ions is decreased as described above, voids may be formed in the dehydrogenated first interlayer dielectric layer 320, which may increase the tensile stress of the first interlayer dielectric layer 320. The tensile stress in the first interlayer dielectric layer 320 may be different depending on particular process conditions used. However, the tensile stress of a first interlayer dielectric layer 320 formed of $O_3$-TEOS may be in the range of about 10 to about 100 MPa before dehydrogenation, and may be about 200 MPa or more after dehydrogenation.

In addition, a plasma treatment, a UV treatment, and/or a thermal treatment may be sequentially performed several times in a dehydrogenation gas atmosphere. For example, after an $O_3$ plasma treatment is performed on the first interlayer dielectric layer 320, an $N_2$ plasma treatment may be performed on the first interlayer dielectric layer 320. Further, after an $O_3$ plasma treatment is performed on the first interlayer dielectric layer 320, an $N_2$ thermal treatment may be performed on the first interlayer dielectric layer 320.

Hereinafter, a semiconductor device according to some embodiments of the invention will be described with reference to FIG. 2D.

Since the dehydrogenated first interlayer dielectric layer 320 is formed on the NMOS transistor 100 according to embodiments of the invention, a current driving ability may be increased in the semiconductor device 1.

Specifically, when the tensile stress of the first interlayer dielectric layer 320 is increased, a compressive stress may occur in the source and drain regions 160 of the NMOS transistor 100 that comes in contact with the first liner layer 310 provided on the lower side of the first interlayer dielectric layer 320. For this reason, a tensile stress occurs in a channel region 146 adjacent to the source and drain regions 160. As described above, when a tensile stress occurs in the channel region 146, the effective mass of carriers in the channel region 146 may be decreased, which may increase the mobility of carriers in the channel region 146. As a result, since the electron mobility may be increased, the current driving ability of the NMOS transistor 100 may be increased.

For example, embodiments where an HDP (High Density Plasma) oxide layer is used as the first interlayer dielectric layer 320 and embodiments where a dehydrogenated $O_3$-TEOS layer is used as the first interlayer dielectric layer 320 are compared with each other and are then explained. The HDP oxide layer has excellent gap-filling characteristics, and thus can reduce differences in height caused by the first gate electrode 120. For this reason, the HDP oxide layer has been commonly used as the first interlayer dielectric layer in conventional semiconductor devices. The HDP oxide layer may have a compressive stress of about −200 MPa, and the dehydrogenated $O_3$-TEOS layer may have a tensile stress of about 200 MPa or more. When differences in stress occur as described above, the current driving ability of the NMOS transistor 100 may increase by more than 10% in proportion to the difference of about 400 MPa in stress. However, the increase in the current driving ability may depend on the characteristics (for example, the channel size, electron concentration, etc.) of the NMOS transistor 100. The increase in the tensile stress due to the plasma treatment will be described in detail below with reference to a second example.

The thickness of the dehydrogenated first interlayer dielectric layer 320 may affect the current driving ability of the NMOS transistor 100 up to a predetermined thickness, after which further increases in thickness of the dehydrogenated first interlayer dielectric layer 320 may have no further effect on the current driving ability of the NMOS transistor 100.

Referring to FIG. 2D, the total thickness of the first gate dielectric layer 110, the first gate electrode 120, and the liner layer 310 of the NMOS transistor 100 is represented by t1, and the total thickness of the liner layer 310 and the dehydrogenated first interlayer dielectric layer 320 is represented by t2. When a dehydrogenated first interlayer dielectric layer 320 is provided on an NMOS transistor, the channel electron mobility of the NMOS transistor increases in proportion to the thickness of the dehydrogenated first interlayer dielectric layer 320 as long as t2/t1<1.14. However, when t2/t1≧1.14 the electron mobility may become saturated, meaning that the electron mobility may not continue to increase, even if the thickness of the dehydrogenated first interlayer dielectric layer 320 is increased further. Accordingly, in order to increase the current driving ability of the NMOS transistor 100 by the dehydrogenation of the first interlayer dielectric layer 320, the first interlayer dielectric layer 320 should be formed to have a thickness such that t2/t1≧1.14. This will be described in detail below with reference to a further example.

Further, since the concentration of hydrogen ions in the first interlayer dielectric layer 320 may be reduced due to dehydrogenation in a semiconductor device 1 according to some embodiments of the invention, the effect of hot electron injection may be decreased. Therefore, the reliability of the first gate dielectric layer 110 may be improved.

Figure 3:
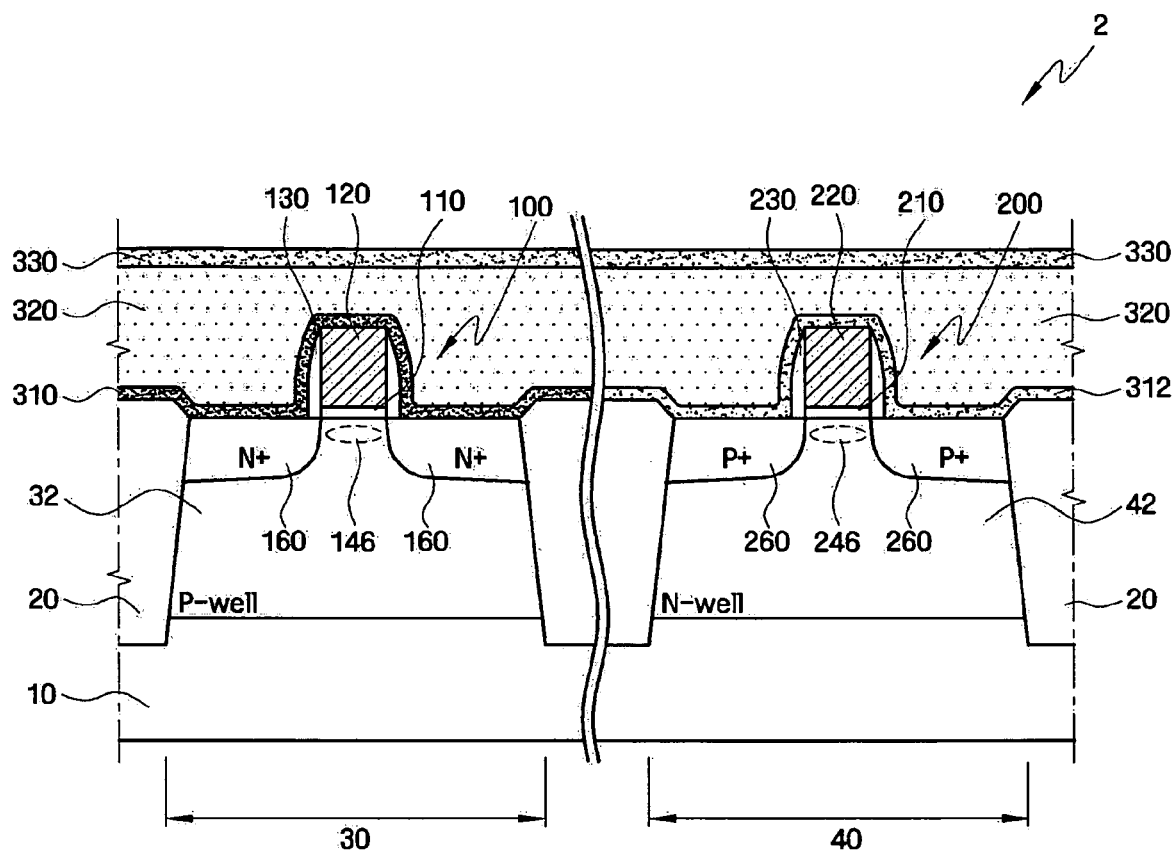
FIG. 3 is a cross-sectional view illustrating methods of manufacturing a semiconductor device according to some embodiments of the invention.

FIG. 3 is a cross-sectional view illustrating methods of manufacturing a semiconductor device 2 according to some embodiments of the invention. In FIG. 3, substantially the same components as those in FIGS. 1 to 2C are denoted by the same reference numerals, and detailed descriptions thereof will be omitted.

Referring to FIG. 3, a semiconductor device 2 according to some embodiments of the invention may further include a capping layer 330 on the first interlayer dielectric layer 320. After the first interlayer dielectric layer 320 is dehydrogenated (block S40 in FIG. 1), the capping layer 330 may be formed on the dehydrogenated first interlayer dielectric layer 320 so as to obstruct or hinder moisture and/or external ions from penetrating into the first interlayer dielectric layer 320.

Specifically, even though the tensile stress of the first interlayer dielectric layer 320 may be increased by the dehydrogenation thereof, if moisture and/or external ions penetrate into the first interlayer dielectric layer 320 in subsequent manufacturing processes, such as processes for forming wires and/or inter-metallic dielectric (IMD) layers, the tensile stress of the first interlayer dielectric layer 320 may again decrease. For example, $O_3$-TEOS, which may be used as a material of the first interlayer dielectric layer 320, may be very hygroscopic in subsequent manufacturing processes.

The moisture and/or external ions may penetrate into the first gate dielectric layer 110, and may cause operational characteristics to deteriorate, for example, the moisture and/or external ions may change the threshold voltage level and/or increase the leakage current of the NMOS transistor 100. Accordingly, the semiconductor device 2 may be provided with the capping layer 330 for reducing or possibly preventing moisture and/or external ions from penetrating into the first interlayer dielectric layer 320.

It may be suitable to form the capping layer 330 in an in-situ process after dehydrogenation of the first interlayer dielectric layer 320. Further, a HDP (High Density Plasma) oxide layer, PE-TEOS (Plasma Enhanced-Tetra Ethyl Ortho Silicate) or the like may be used as the capping layer 330.

Figure 4:
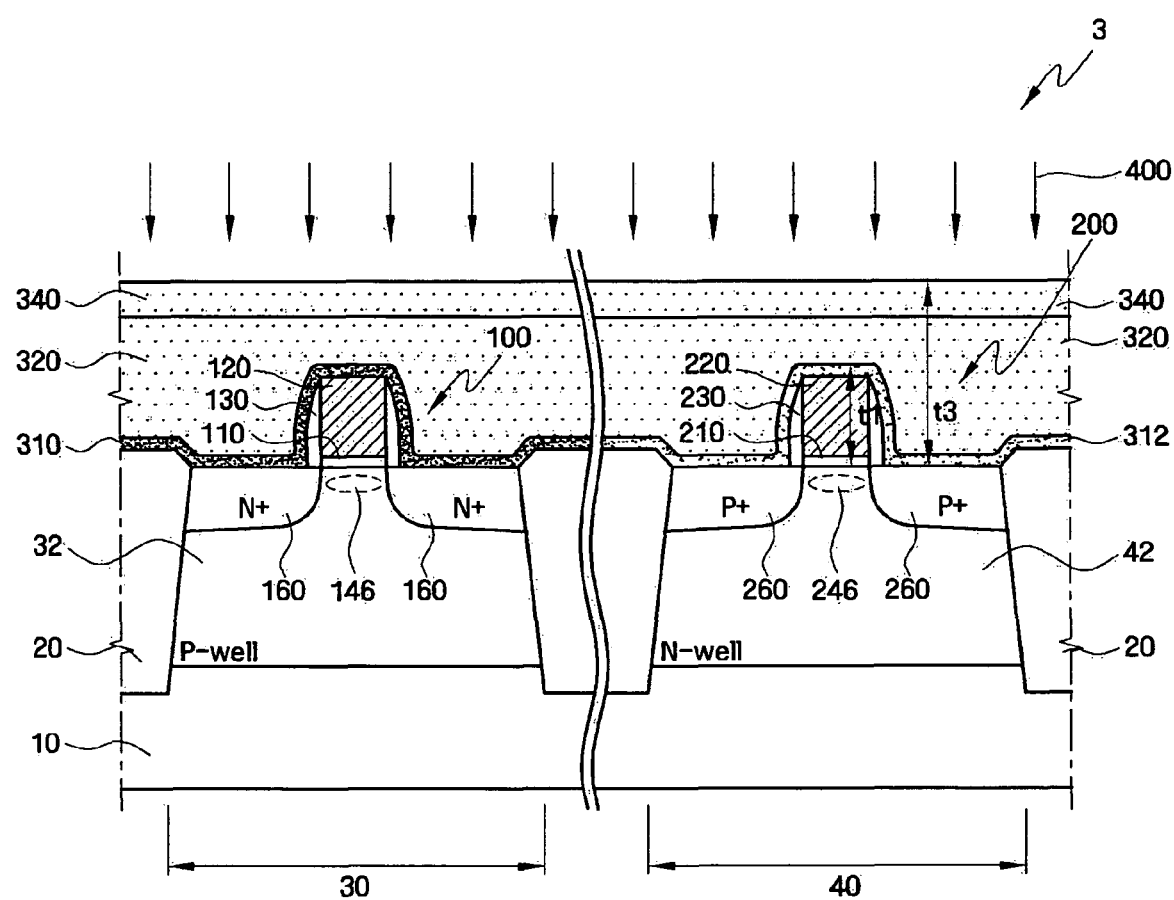
FIG. 4 is a cross-sectional view illustrating methods of manufacturing a semiconductor device according to some embodiments of the invention.

FIG. 4 is a cross-sectional view illustrating methods of manufacturing a semiconductor device according to some embodiments of the invention. In FIG. 4, substantially the same components as those in FIGS. 1 to 2C are denoted by the same reference numerals, and detailed descriptions thereof will be omitted.

Referring to FIG. 4, a semiconductor device 3 according to some embodiments of the invention may further include an additional dehydrogenated interlayer dielectric layer 340. After the first interlayer dielectric layer 320 is dehydrogenated (block S40 in FIG. 1), an additional interlayer dielectric layer 340 may be formed on the dehydrogenated first interlayer dielectric layer 320.

Specifically, an additional interlayer dielectric layer 340 having a stress is formed on the first interlayer dielectric layer 320, and the additional interlayer dielectric layer 340 is dehydrogenated so as to change the stress thereof.

The additional interlayer dielectric layer 340 may be dehydrogenated, for example, by a plasma treatment 400 and/or a thermal treatment, which may be performed in a dehydrogenation gas atmosphere. A case where the plasma treatment 400 is performed on the additional interlayer dielectric layer is exemplified in FIG. 4. The additional interlayer dielectric layer 340 may include $O_3$-TEOS, USG, PSG, BSG, BPSG, FSG, SOG, TOSZ, or the like, and may be formed using, for example, a CVD method, a spin coating method, or the like. Furthermore, the dehydrogenation gas may include $N_2$, $O_2$, $O_3$, $N_2O$, $H_2$, $D_2$ and/or a combination thereof. A dehydrogenation process, for example, plasma treatment, UV treatment, and/or thermal treatment may be performed repeatedly several times in a dehydrogenation gas atmosphere.

Since the tensile stress of the additional interlayer dielectric layer 340 may increase when dehydrogenated as described above, the current driving ability of the NMOS transistor may be increased.

Further, although not shown in the Figures, a series of processes that form the additional interlayer dielectric layer 340 and dehydrogenate the additional interlayer dielectric layer 340 may be performed repeatedly so as to form the interlayer dielectric layer 320 and several additional interlayer dielectric layers 340 on the NMOS transistor 100.

The thickness of the additional dehydrogenated interlayer dielectric layer 340 may affect the current driving ability of the NMOS transistor up to a predetermined thickness, beyond which the thickness of the additional dehydrogenated dielectric interlayer may not have an additional effect on the current driving ability of the NMOS transistor.

Specifically, referring to FIG. 4, the total thickness of the first gate dielectric layer 110, the first gate electrode 120, and the liner layer 310 of the NMOS transistor 100 is represented by t1, and the total thickness of the liner layer 310, the dehydrogenated first interlayer dielectric layer 320, and the dehydrogenated additional interlayer dielectric layer 340 is represented by t3. In this case, the electron mobility may increase in proportion to the thickness of the dehydrogenated first interlayer dielectric layer 320 as long as $t3/t1 < 1.14$. However, when $t3/t1 \geq 1.14$, the electron mobility may not increase further, even if the thickness of the dehydrogenated additional interlayer dielectric layer 340 is increased or if several additional interlayer dielectric layers 340 are formed. Accordingly, a condition of $t3/t1 \geq 1.14$ should be satisfied to maximize the current driving ability of the NMOS transistor 100.

Figure 5:
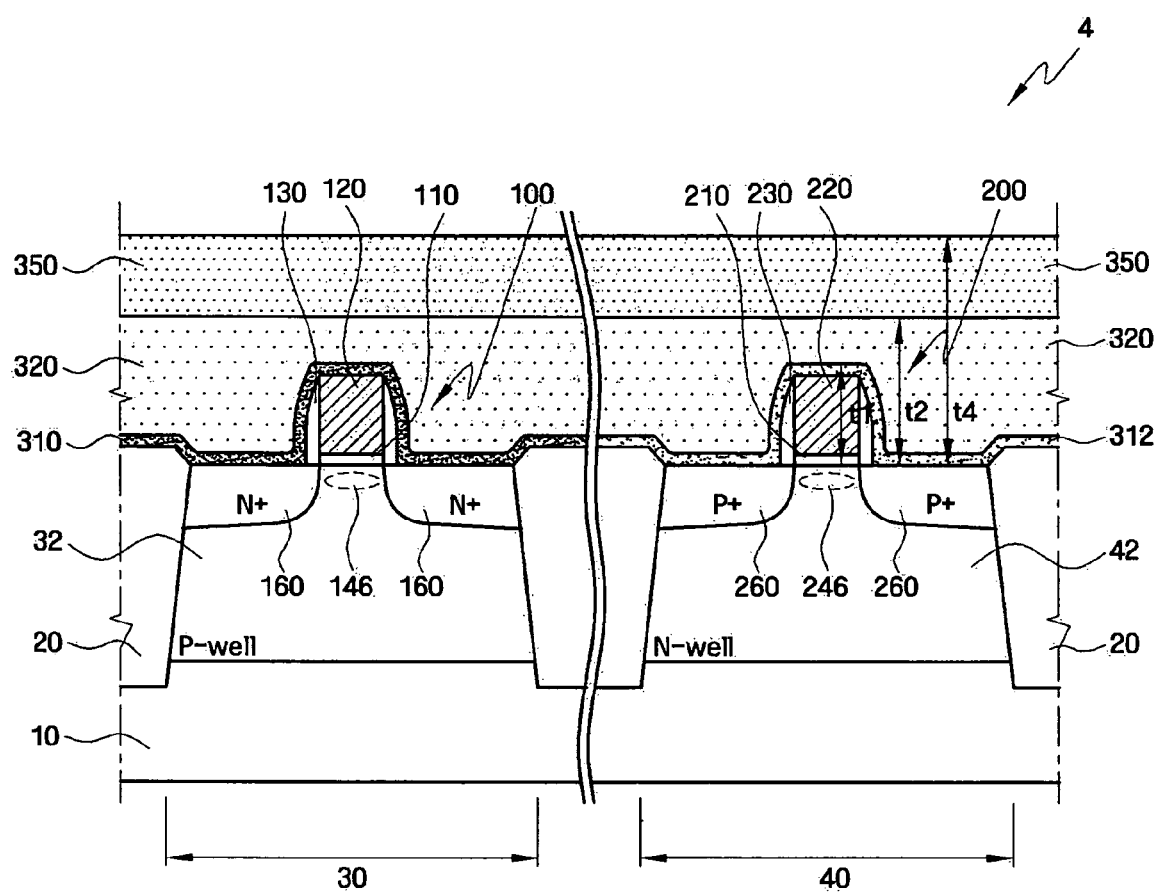
FIG. 5 is a cross-sectional view illustrating methods of manufacturing a semiconductor device according to some embodiments of the invention.

FIG. 5 is a cross-sectional view illustrating methods of manufacturing a semiconductor device 4 according to some embodiments of the invention. In FIG. 5, substantially the same components as those in FIGS. 1 to 2C are denoted by the same reference numerals, and detailed descriptions thereof will be omitted.

Referring to FIG. 5, a semiconductor device 4 according to some embodiments of the invention may further include a second interlayer dielectric layer 350 having a stress smaller than that of the dehydrogenated first interlayer dielectric layer 320. After the first interlayer dielectric layer 320 is dehydrogenated (block S40 in FIG. 1), the second interlayer dielectric layer 350 is formed on the dehydrogenated first interlayer dielectric layer 320.

Specifically, the total thickness of the interlayer dielectric layer of the semiconductor device should be larger than a predetermined thickness t4 in order to reduce electrical coupling between the NMOS transistor 100 and metal wires formed on the interlayer dielectric layer. However, if an interlayer dielectric layer having a thickness larger than the predetermined thickness t4 is dehydrogenated to increase its tensile stress, the portion of the interlayer dielectric layer close to its surface may be sufficiently dehydrogenated, but the portion of the interlayer dielectric layer close to the source and drain regions 160 may not be sufficiently dehydrogenated. Accordingly, the tensile stress of the portion of the interlayer dielectric layer close to the source and drain regions 160 may not be sufficiently increased.

Referring to FIG. 5, the total thickness of the first gate dielectric layer 110, the first gate electrode 120, and the liner layer 310 of the NMOS transistor 100 is represented by t1, and the total thickness of the liner layer 310 and the dehydrogenated first interlayer dielectric layer 320 is represented by t2. The first interlayer dielectric layer 320 may be formed to have a predetermined thickness so that the first interlayer dielectric layer 320 satisfies a condition of $t2/t1 \geq 1.14$ and so that a portion thereof close to the source and drain regions 160 may also be easily dehydrogenated. The first interlayer dielectric layer 320 may be dehydrogenated so as to increase the tensile stress thereof.

Subsequently, the second interlayer dielectric layer 350 having a predetermined thickness of at least about (t4−t2) may be formed on the first interlayer dielectric layer 320. Since the second interlayer dielectric layer 350 is formed at the portion distant from the NMOS transistor by the thickness t2, the second interlayer dielectric layer 350 may not have an effect on the current driving ability of the NMOS transistor 100. For this reason, the interlayer dielectric layer may be formed to have the thickness t4 regardless of the magnitude of the stress of the second interlayer dielectric layer 350. Accordingly, the stress of the second interlayer dielectric layer 350 may be smaller than that of the first interlayer dielectric layer 320. That is, since a compressive stress has a negative value and a tensile stress has a positive value, the stress of the second interlayer dielectric layer 350 may be compressive or may be a tensile stress smaller than that of the first interlayer dielectric layer 320.

Figure 6A:
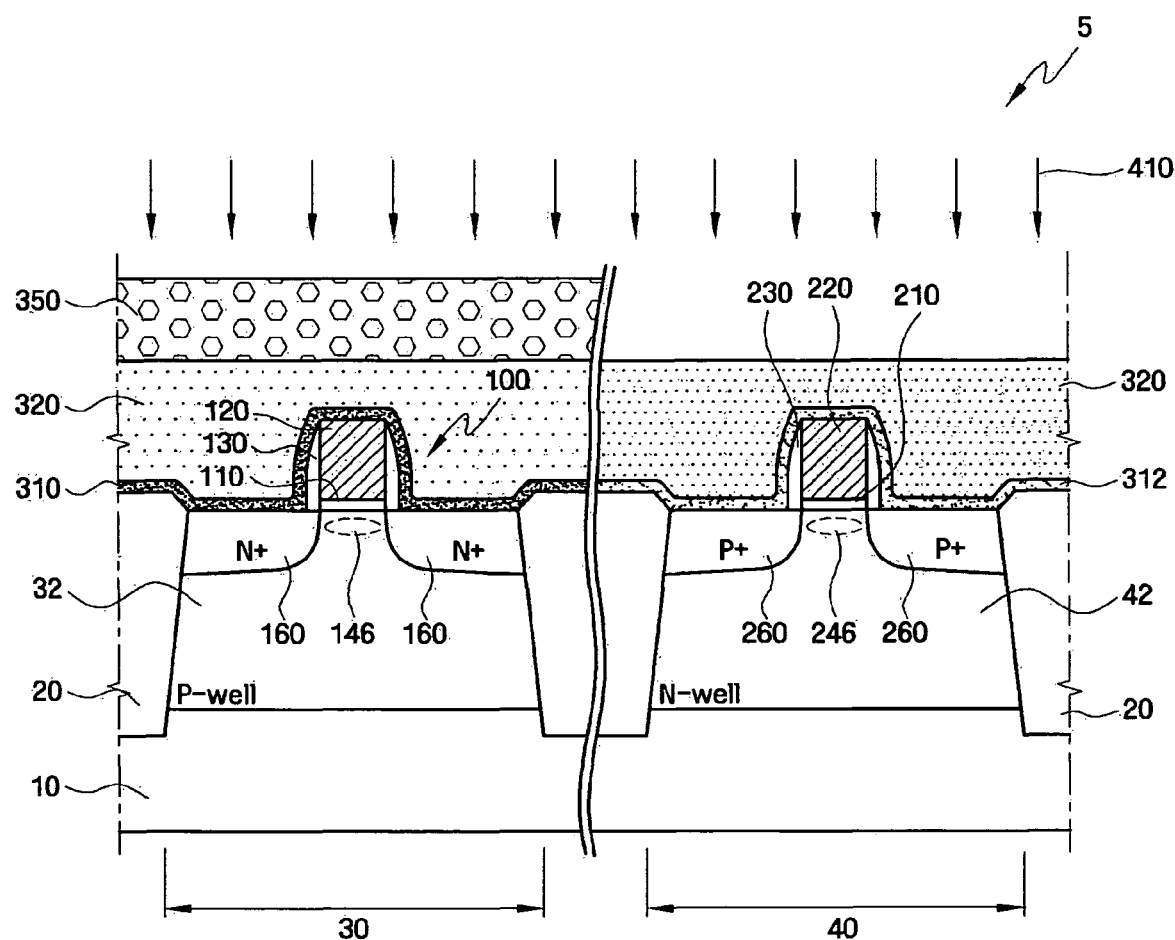
FIG. 6A is a cross-sectional view illustrating methods of manufacturing a semiconductor device according to some embodiments of the invention.
Figure 6B:
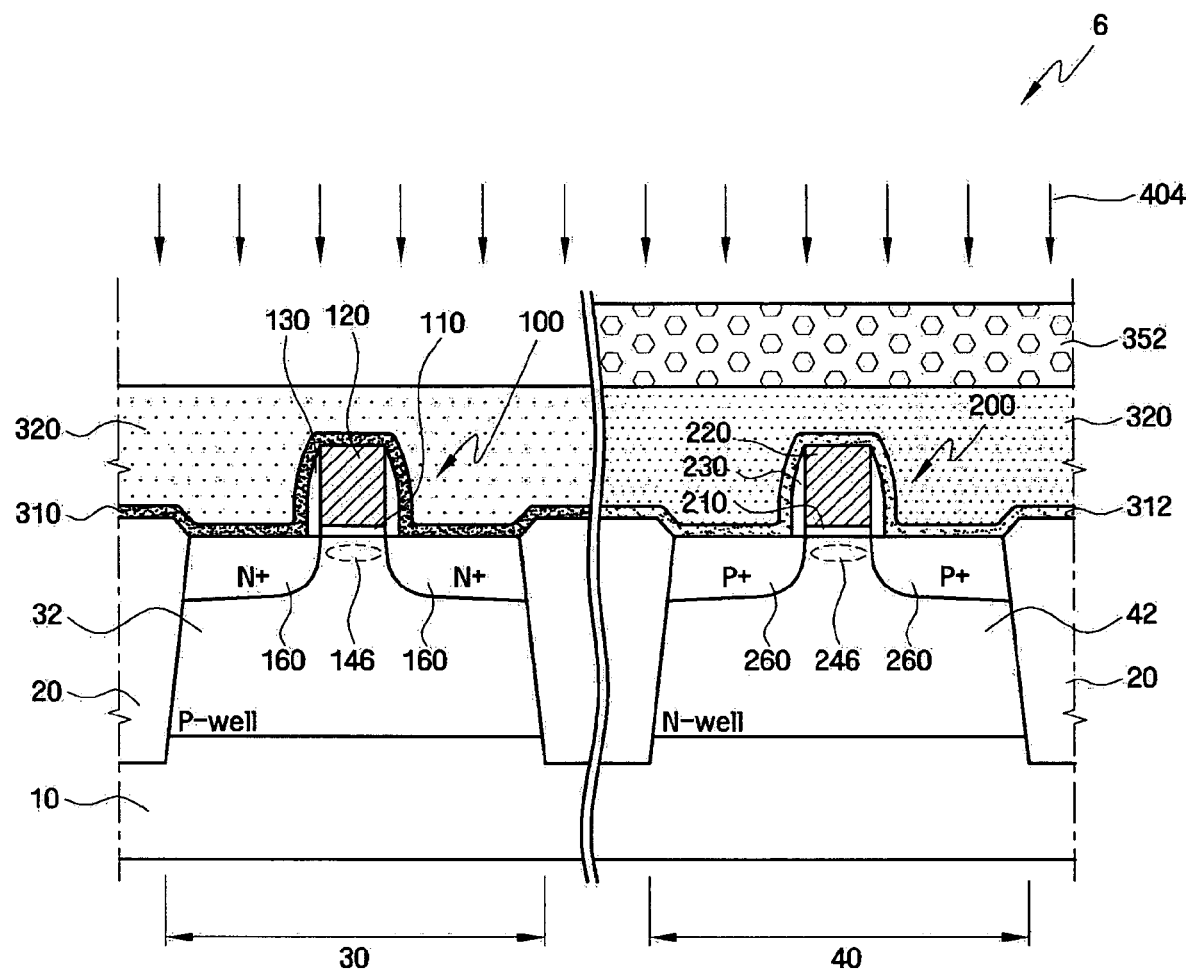
FIG. 6B is a cross-sectional view illustrating methods of manufacturing a semiconductor device according to some embodiments of the invention.

FIG. 6A is a cross-sectional view illustrating methods of manufacturing a semiconductor device 5 according to some embodiments of the invention, and FIG. 6B is a cross-sectional view illustrating methods of manufacturing a semiconductor device 6 according to further embodiments of the invention. In FIGS. 6A and 6B, substantially the same components as those in FIGS. 1 to 2C are denoted by the same reference numerals, and detailed descriptions thereof will be omitted.

Referring to FIGS. 6A and 6B, a compressive stress should be applied to a channel region 246 of the PMOS transistor 200 to improve hole mobility therein. However, since the first interlayer dielectric layer 320, when dehydrogenated as described above, applies a tensile stress to the channel region 246 of the PMOS transistor 200, the first interlayer dielectric layer 320 may cause the current driving ability of the PMOS transistor 200 to deteriorate.

In the semiconductor device 5 according to some embodiments of the invention, after the first interlayer dielectric layer 320 is dehydrogenated (see block S40 in FIG. 1), germanium and/or nitrogen ions 410 may be implanted into the dehydrogenated first interlayer dielectric layer 320 formed on the PMOS transistor 200 by using a mask pattern 350 that covers the NMOS transistor 100, as shown in FIG. 6A. As a result, it may be possible to reduce the tensile stress of the portion of the dehydrogenated first interlayer dielectric layer 320 above the PMOS transistor 200. In addition to the dehydrogenated first interlayer dielectric layer 320, the germanium and/or nitrogen ions may simultaneously be implanted into the liner layer 312 on the PMOS transistor 200, as discussed above.

Referring to FIG. 6B, in a semiconductor device 6 according to some embodiments of the invention, a mask pattern 352 covering the PMOS transistor 200 may be formed before the first interlayer dielectric layer 320 is dehydrogenated (see block S40 in FIG. 1). Subsequently, the first interlayer dielectric layer 320 is dehydrogenated (for example, a plasma treatment 404 may be performed on the first interlayer dielectric layer 320 in a dehydrogenation gas atmosphere). As a result, it is possible to apply a tensile stress only to the portion of the first interlayer dielectric layer 320 formed on the NMOS transistor 100.

In this way, may be is possible to also maintain the current driving characteristics of the PMOS transistor 200.

Figure 7:
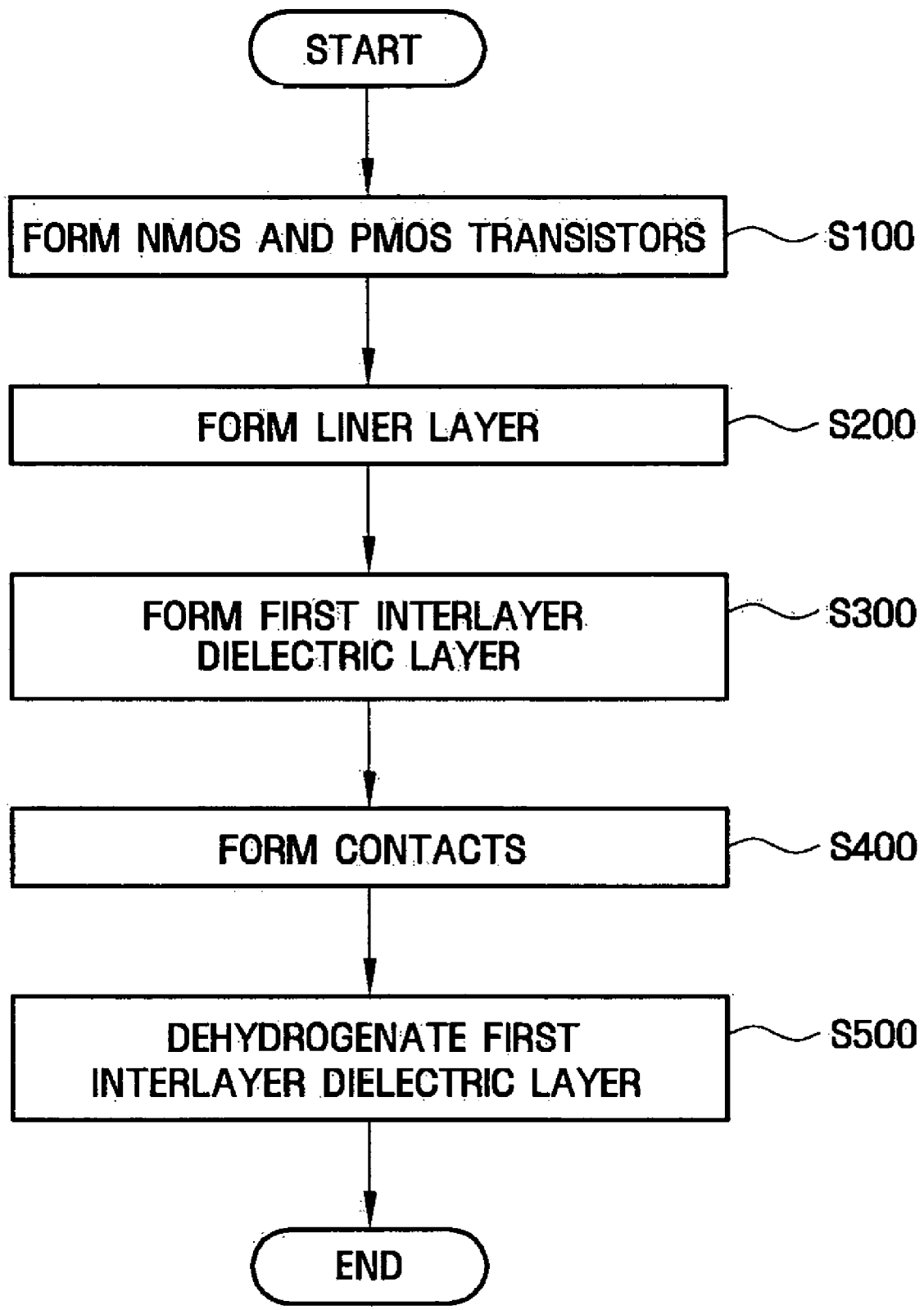
FIG. 7 is a flowchart illustrating methods of manufacturing a semiconductor device according to some embodiments of the invention.

Methods of manufacturing a semiconductor device 7 according to some embodiments of the invention will be described with reference to FIG. 7 and FIGS. 8A to 8E. FIG. 7 is a flowchart illustrating methods of manufacturing a semiconductor device 7 according to some embodiments of the invention, and FIGS. 8A to 8E are cross-sectional views illustrating methods of manufacturing a semiconductor device 7 according to some embodiments of the invention.

The methods of manufacturing a semiconductor device 7, which are illustrated in FIGS. 8A to 8E, according to some embodiments of the invention are substantially similar to the methods illustrated in FIGS. 2A to 2C. Accordingly, a detailed description thereof will be omitted.

The methods of manufacturing a semiconductor device, which are illustrated in FIG. 7 and FIGS. 8A to 8E, will be described below. An NMOS transistor 100 and a PMOS transistor 200 are formed on a semiconductor substrate 10 (block S100). First and second liner layers 310 and 312 are formed on the NMOS transistor 100 and the PMOS transistor 200, respectively (block S200). Then, a first interlayer dielectric layer 320 having a predetermined stress is formed on the first and second liner layers 310 and 312 (block S300).

Subsequently, referring to FIGS. 7, 8D, and 8E, contacts 328 that may connect the NMOS and PMOS transistors 100 and 200 with metal wires are formed in the first interlayer dielectric layer 320 (block S400). Therefore, the first interlayer dielectric layer 320 may be distinguished from an intermetallic dielectric (IMD) layer used to insulate the metal wires.

Figure 8A:
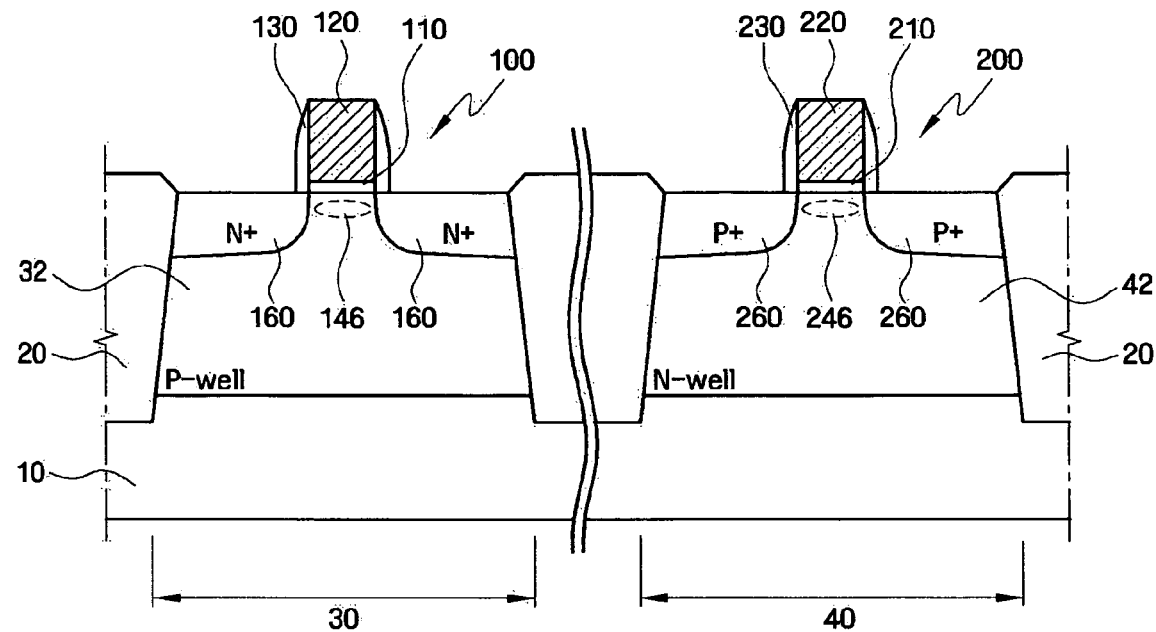
FIGS. 8A to 8E are cross-sectional views illustrating methods of manufacturing a semiconductor device according to some embodiments of the invention.
Figure 8B:
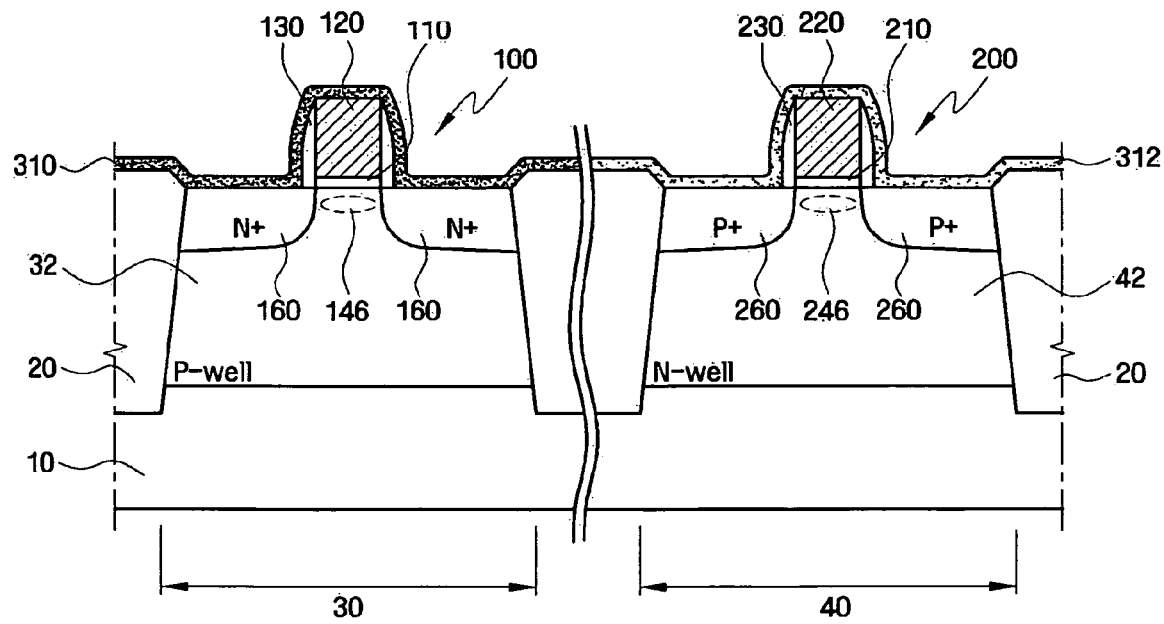
Figure 8C:
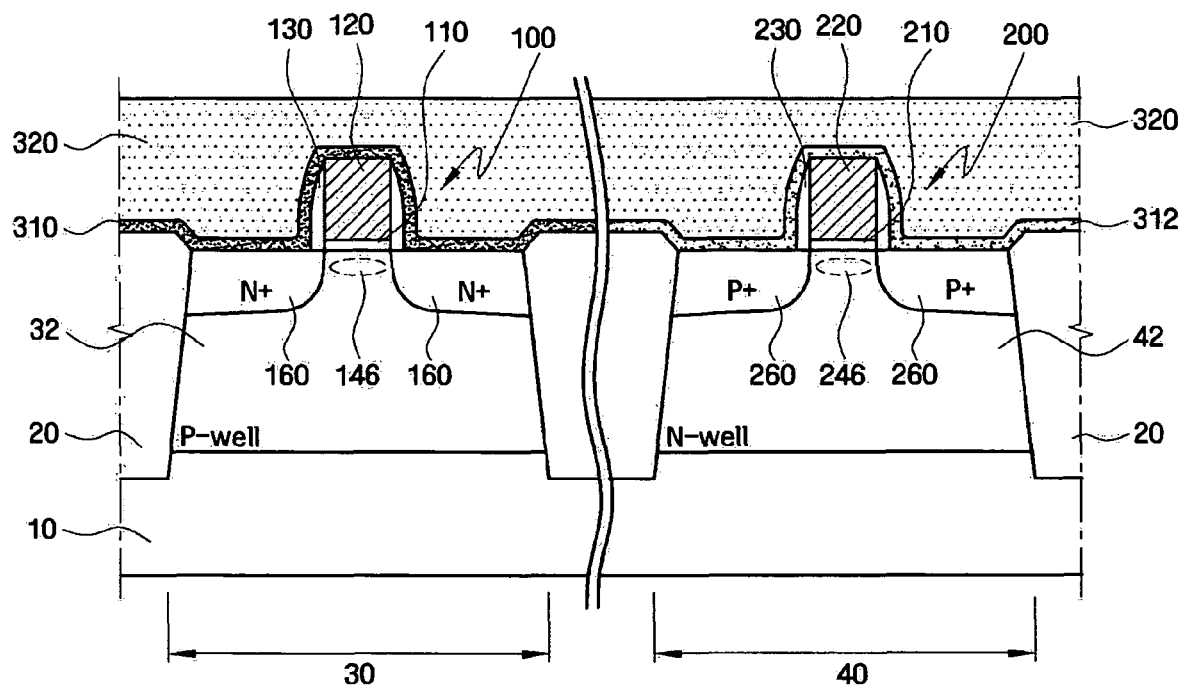
Figure 8D:
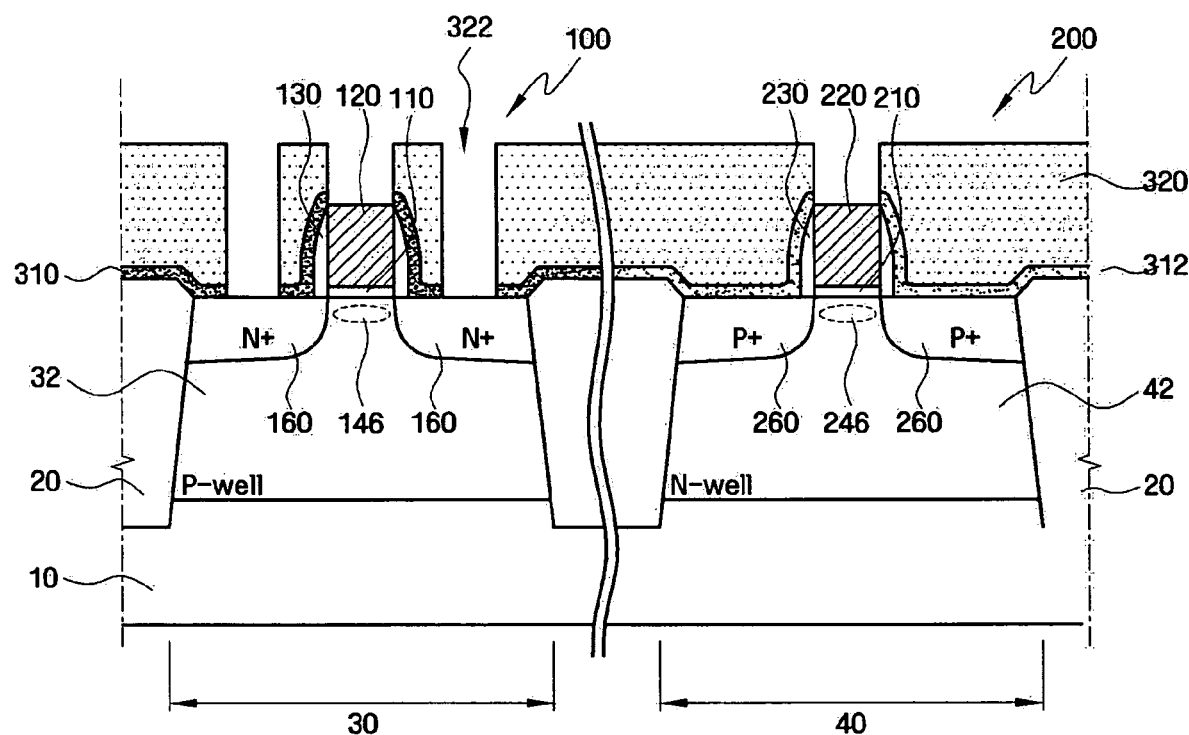

Specifically, as shown in FIG. 8D, a photoresist pattern (not shown) used to form contact holes 322 is formed on the first interlayer dielectric layer 320. Subsequently, while the photoresist pattern (not shown) is used as an etch mask, the first interlayer dielectric layer 320 is partially etched until the gate electrodes 120 and 220 and the source and drain regions 160 and 260 are exposed to the outside, thereby forming the contact holes 322. That is, the surfaces of the gate electrodes 120 and 220 and/or the source and drain regions 160 and 260 are exposed to the outside through each of the contact holes 322.

Figure 8E:
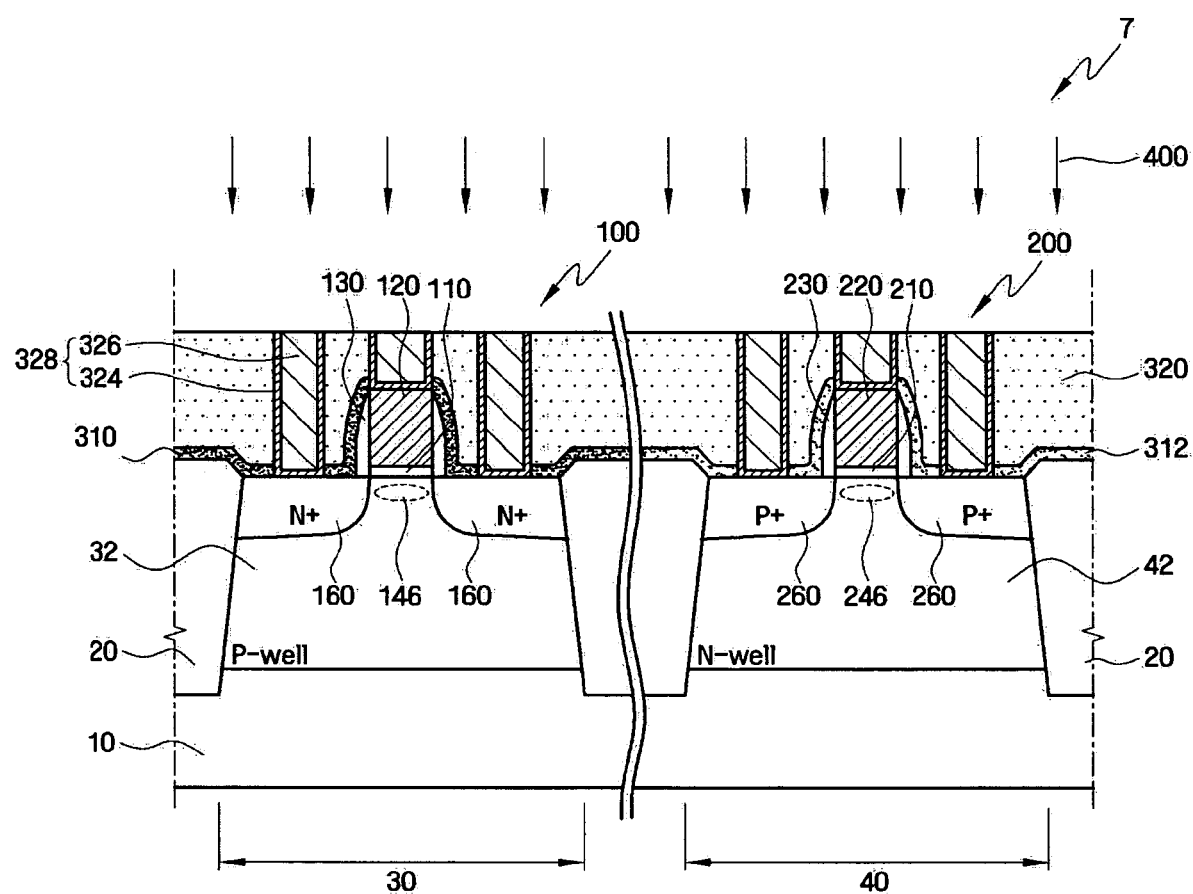

After that, as shown in FIG. 8E, the contacts 328 are formed so as to be buried in the contact holes 322. In this case, each of the contacts 328 is formed of a barrier layer 324 and a metal layer 326 that are conformally formed on the inner surface of each contact hole.

The barrier layer 324 may include an ohmic adhesion layer that may improve a contact property of a metal layer to be buried in each contact hole 322, and a diffusion barrier that prevents the reaction between a metal material and silicon that may occur due to the diffusion of the metal material. In this case, the ohmic layer may be formed by conformally depositing a refractory metal such as Ti or Ta on the surface of the contact hole, and the diffusion barrier may be formed by depositing TiN and/or TaN on the surface of the ohmic layer.

Next, a metal material is formed in each of the contact holes 322 so as to form the contacts 328. In this case, the barrier layer 324 is formed on the inner surface of each contact hole 322. Each of the contacts 328 may be formed by depositing a metal material such as W, Cu, and/or Al in each of the contact holes 328.

Subsequently, a planarization process such as a CMP (Chemical Mechanical Polishing) or etch back may be performed until at least a portion of the surface of the first interlayer dielectric layer 320 is exposed to the outside.

After that, referring to FIGS. 7 and 8E, the first interlayer dielectric layer 320 is dehydrogenated so as to change the stress thereof (block S500).

More specifically, a dehydrogenation process 400 for removing hydrogen ions from the first interlayer dielectric layer 320 is performed, so that voids may be formed in the first interlayer dielectric layer 320, which may change the stress thereof.

A plasma treatment, a UV treatment, and/or a thermal treatment may be performed on the first interlayer dielectric layer 320 in a dehydrogenation gas atmosphere in order to dehydrogenate the first interlayer dielectric layer 320. Further, the dehydrogenation gas may include $N_2$, $O_2$, $O_3$, $N_2O$, $H_2$, and/or $D_2$.

For example, if the first interlayer dielectric layer 320 is formed of $O_3$-TEOS and a plasma treatment, a UV treatment and/or or a thermal treatment is performed in the dehydrogenation gas atmosphere so as to dehydrogenate the first interlayer dielectric layer 320, the Si—OH bonding may be decreased in the dehydrogenated first interlayer dielectric layer 320. As described above, if the concentration of the hydrogen ions is decreased, voids may be formed in the dehydrogenated first interlayer dielectric layer 320, which may increase the tensile stress therein. Although the tensile stress may be different depending process conditions, the tensile stress of the layer formed of $O_3$-TEOS may typically be in the range of about 10 to 100 MPa before dehydrogenation and may be about 200 MPa or more after dehydrogenation.

In addition, a plasma treatment, UV treatment, and/or thermal treatment may be sequentially performed several times in a dehydrogenation gas atmosphere. For example, after an $O_3$ plasma treatment is performed on the first interlayer dielectric layer 320, an $N_2$ plasma treatment may be performed on the first interlayer dielectric layer 320. Alternatively or additionally, after an $O_3$ plasma treatment is performed on the first interlayer dielectric layer 320, an $N_2$ plasma thermal treatment may be performed on the first interlayer dielectric layer 320.

As described above, when the contacts 328 are formed in the first interlayer dielectric layer 320 and the first interlayer dielectric layer 320 is dehydrogenated, it may be possible to reduce the stress of the first interlayer dielectric layer 320 during the formation of the contacts and/or to obstruct or hinder moisture from penetrating into the first interlayer dielectric layer 320.

In a semiconductor device 7 according to some embodiments of the invention, since the dehydrogenated first interlayer dielectric layer 320 is formed on the NMOS transistor 100, the current driving ability of the NMOS transistor may be increased.

Specifically, when the tensile stress of the first interlayer dielectric layer 320 is increased, a compressive stress may occur in the source and/or drain regions 160 of the NMOS transistor 100 that comes in contact with the first liner layer 310 provided on the lower side of the first interlayer dielectric layer 320. For this reason, a tensile stress may occur in a channel region 146 adjacent to the source and drain regions 160. As described above, when a tensile stress occurs in the channel region 146, the effective mass of carriers may be decreased in the channel region 146. As a result, since the electron mobility may be increased, the current driving ability of the NMOS transistor 100 may be increased.

Figure 9:
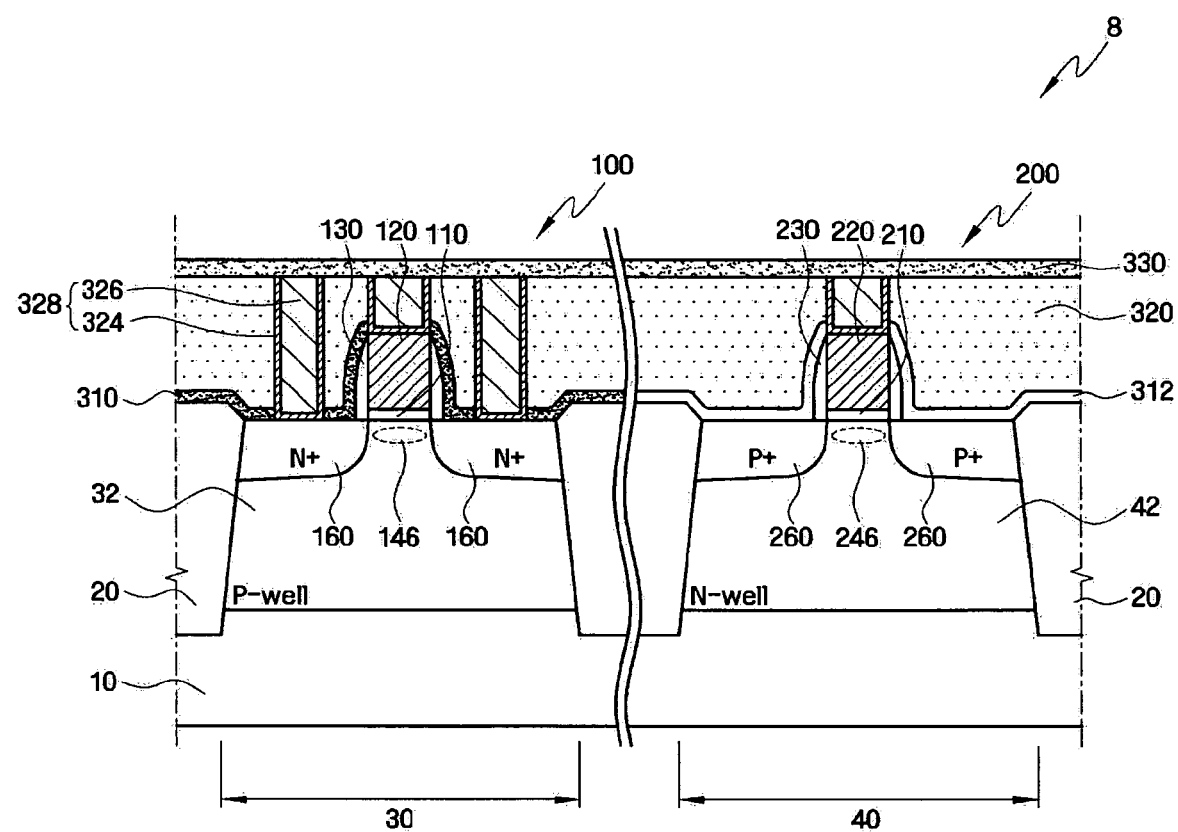
FIG. 9 is a cross-sectional view showing a semiconductor device according to some embodiments of the invention.

A semiconductor device 8 according to some embodiments of the invention will be described in detail with reference to FIG. 9. FIG. 9 is a cross-sectional view showing a semiconductor device 8 according to some embodiments of the invention. In FIG. 9, substantially the same components as those in FIGS. 8A to 8C are denoted by the same reference numerals, and detailed descriptions thereof will be omitted.

Referring to FIG. 9, the semiconductor device 8 according to some embodiments of the invention may further include a capping layer 330 on the first interlayer dielectric layer 320. After the contacts 328 are formed in the first interlayer dielectric layer 320 and the first interlayer dielectric layer 320 is dehydrogenated, the capping layer 330 may be formed on the first interlayer dielectric layer 320 so as to obstruct or hinder moisture and/or external ions from penetrating into the first interlayer dielectric layer 320.

Specifically, even though the tensile stress of the first interlayer dielectric layer 320 may be increased by the dehydrogenation thereof, if moisture and/or external ions penetrate into the first interlayer dielectric layer 320 in subsequent manufacturing processes, such as processes for forming wires and inter-metallic dielectric (IMD) layers, the tensile stress of the first interlayer dielectric layer 320 may be decreased again. For example, $O_3$-TEOS, which may be used as a material of the first interlayer dielectric layer 320, may be very hygroscopic in subsequent manufacturing processes.

The moisture and/or external ions may penetrate into the first gate dielectric layer 110, and may cause operational characteristics to deteriorate. That is, the moisture and/or external ions may change the threshold voltage level and/or increase leakage current of the NMOS transistor 100. Accordingly, the semiconductor device 8 may be provided with the capping layer 330 for obstructing or hindering moisture and/or or external ions from penetrating into the first interlayer dielectric layer 320.

It may be suitable to form the capping layer 330 in an in-situ process after the dehydrogenation of the first interlayer dielectric layer 320. Further, a HDP (High Density Plasma) oxide layer, PE-TEOS (Plasma Enhanced-Tetra Ethyl Ortho Silicate), SiN, SiON, or the like may be used as the capping layer 330.

Although the invention has been described in connection with the exemplary embodiments of the invention, it will be apparent to those skilled in the art that various modifications and changes may be made thereto without departing from the scope and spirit of the invention. Therefore, it should be understood that the above embodiments are not limiting, but are illustrative of some embodiments of the invention.

A further description of some embodiments of the invention will be provided with reference to the following specific examples.

By way of first examples, a liner layer having a predetermined tensile stress was formed on an NMOS transistor, and an $O_3$-TEOS layer was formed on the liner layer so as to be used as a first interlayer dielectric layer. Next, the chemical composition of the first interlayer dielectric layer was analyzed using an FT-IR (Fourier Transform-Infrared) spectrometer. Subsequently, after an $O_3$ plasma treatment was performed on the first interlayer dielectric layer formed on the NMOS transistor, the chemical composition of the first interlayer dielectric layer was analyzed using the FT-IR (Fourier Transform-Infrared) spectrometer. The results are shown in FIG. 10.

Figure 10:
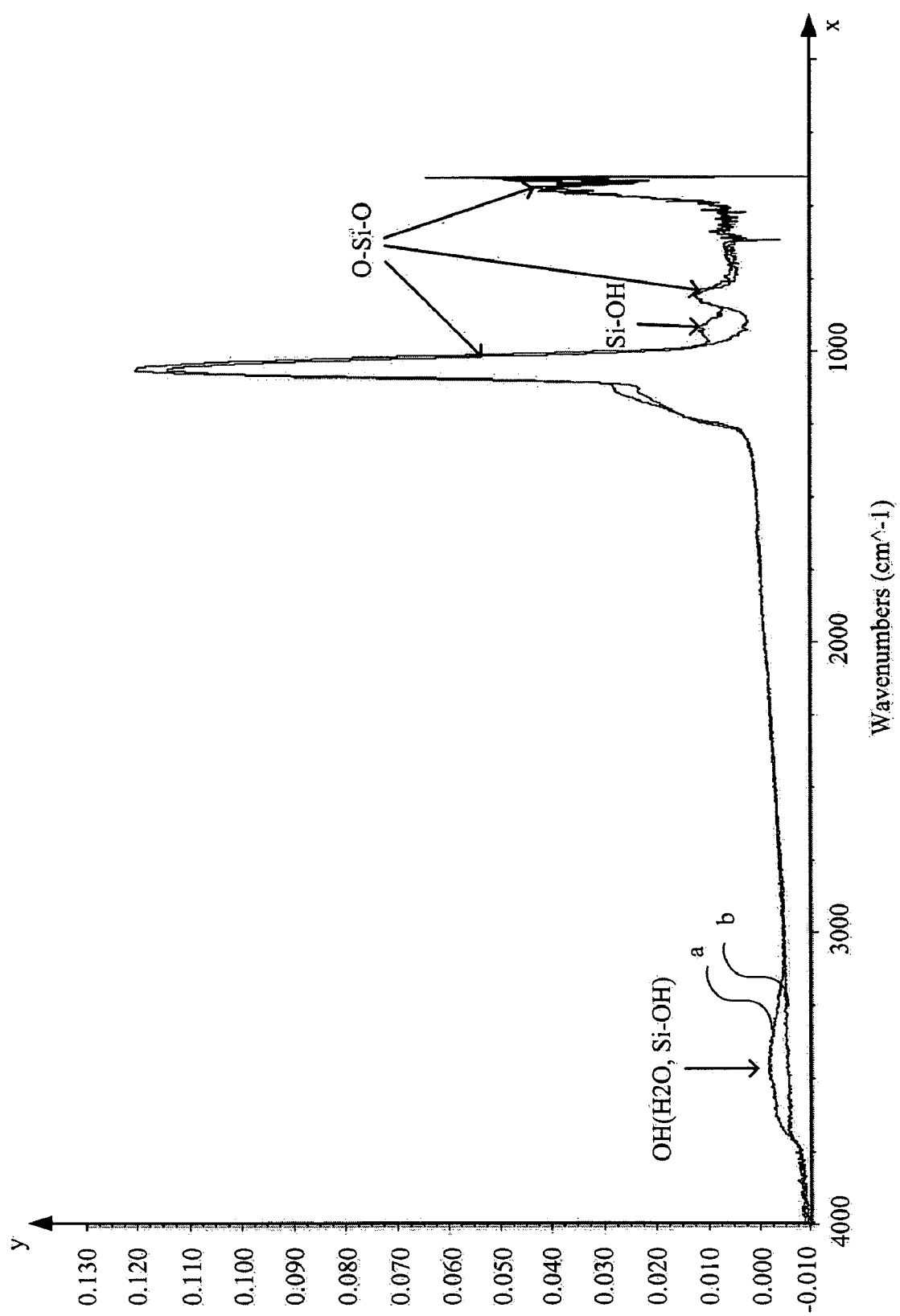
FIG. 10 is a graph showing results that are obtained by analyzing changes in composition of an $O_3$-TEOS layer before and after an $O_3$ plasma treatment by using an FT-IR (Fourier Transform-Infrared) spectrometer when the $O_3$-TEOS layer is formed on an NMOS transistor according to some embodiments of the invention.

In FIG. 10, the X-axis represents wavenumber ($cm^{-1}$), and the Y-axis represents absorbance. The FT-IR radiates infrared rays into molecules, and absorbs and emits rays having a wavelength (in the range of about 4000 to 400 $cm^{-1}$) corresponding to a characteristic vibration energy based on a bonding structure of atoms in molecules. In this case, the FT-IR spectrometer measures changes in wavelength to analyze the chemical composition of the first interlayer dielectric layer. A letter 'a' in FIG. 10 indicates a result before the $O_3$ plasma treatment, and a letter 'b' in FIG. 10 indicates a result after the $O_3$ plasma treatment. When the "a" and "b" are compared with each other, it can be understood that peak values of OH ($H_2O$, Si—OH) and Si—OH are lowered in the 'b' sample. Accordingly, if the $O_3$ plasma treatment is performed on the first interlayer dielectric layer, it can be understood that the concentration of hydrogen ions in the first interlayer dielectric layer is lowered.

In second examples, a liner layer having a predetermined tensile stress was formed on first to fourth NMOS transistors, and an $O_3$-TEOS layer was formed on the liner layer so as to be used as a first interlayer dielectric layer. Next, the magnitude of the stress of the as-deposited first interlayer dielectric layer was measured on each of the NMOS transistors (As-Depo). Subsequently, an $NH_3$ plasma treatment, an $O_3$ plasma treatment, an $N_2$ plasma treatment, and the $N_2$ plasma treatment after the $O_3$ plasma treatment were performed on the first interlayer dielectric layer formed on the first to fourth NMOS transistors, respectively. Then, the magnitude of the stress of the first interlayer dielectric layer was measured on each of the NMOS transistors (Treatment). The results thereof are shown in FIG. 11.

Figure 11:
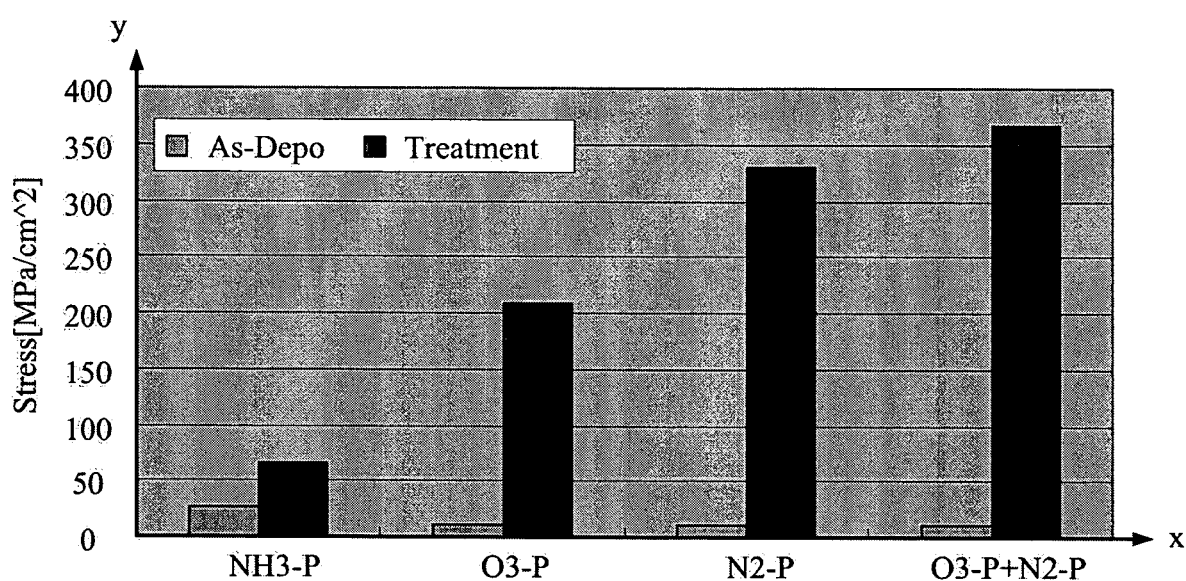
FIG. 11 is a graph showing results that are respectively obtained by measuring the magnitudes of stresses of an $O_3$-TEOS layer before and after an $NH_3$ plasma treatment, an $O_3$ plasma treatment, an $N_2$ plasma treatment, and an $N_2$ plasma treatment after an $O_3$ plasma treatment when an $O_3$-TEOS layer is formed on an NMOS transistor according to some embodiments of the invention.

In FIG. 11, the X-axis represents the type of a plasma treatment, and the Y-axis represents the magnitude of a tensile stress of the first interlayer dielectric layer. Since the $NH_3$ plasma treatment is not effective at removing ions in the first interlayer dielectric layer, it can be understood that the tensile stress of the first interlayer dielectric layer is not significantly increased from before to after the $NH_3$ plasma treatment. Meanwhile, when the $O_3$ plasma treatment, the $N_2$ plasma treatment, and the $N_2$ plasma treatment after the $O_3$ plasma treatment were performed on the first interlayer dielectric layer, respectively, it can be seen that the magnitudes of the tensile stress of the first interlayer dielectric layer were increased to be about 210 MPa, 330 MPa, and 370 MPa, respectively, as compared to about 10 MPa before the plasma treatment. That is, it is believed that the $O_3$ plasma treatment, the $N_2$ plasma treatment, and the like may be effective at removing ions in the first interlayer dielectric layer.

In third examples, the following conditions were set in a simulation program. In the simulation conditions, a liner layer having a predetermined tensile stress was provided on an NMOS transistor, and a first interlayer dielectric layer was provided on the liner layer. Next, while the thickness of the first interlayer dielectric layer was changed, the change of electron mobility was simulated depending on the change of the thickness of the first interlayer dielectric layer. The results are shown in FIG. 12.

Figure 12:
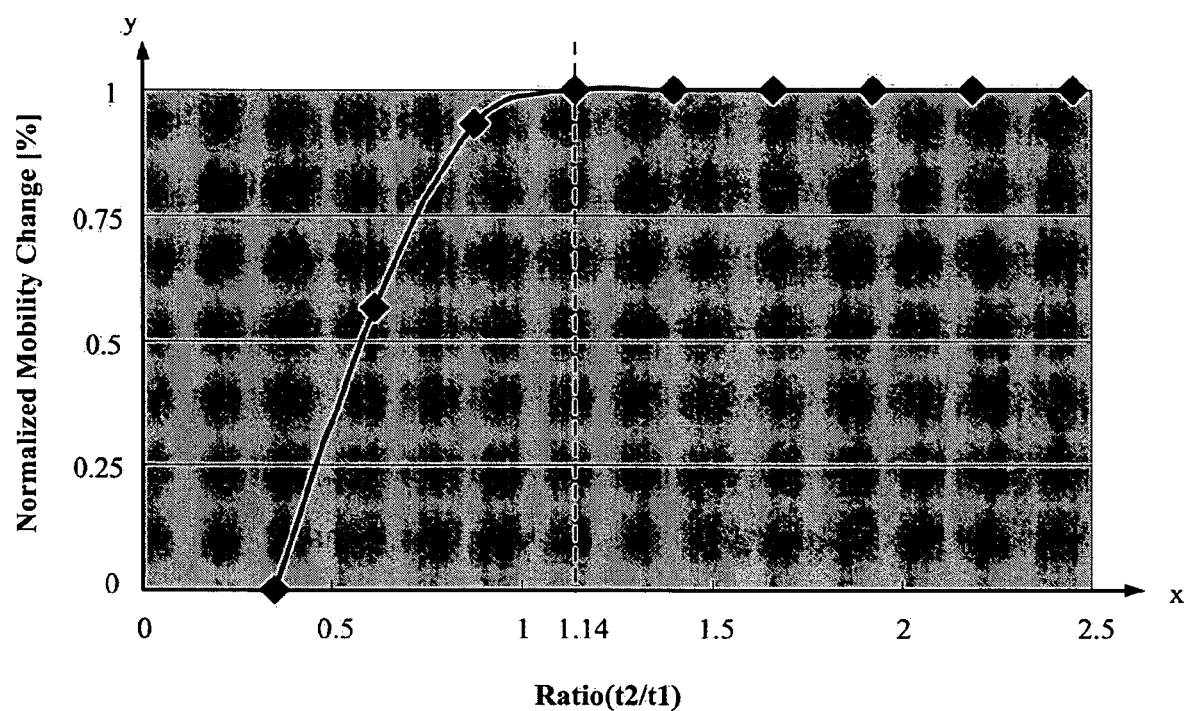
FIG. 12 is a graph showing results that may be obtained by simulating changes in electron mobility in accordance with changes in thickness of a first interlayer dielectric layer formed on the NMOS transistor according to some embodiments of the invention.

In FIG. 12, the X-axis represents t2/t1 (where t1 indicates the total thickness of a gate dielectric layer, a gate electrode, and a liner layer of the NMOS transistor, and t2 indicates the total thickness of a liner layer and a dehydrogenated first interlayer dielectric layer), and the Y-axis represents changes in normalized electron mobility. It can be understood that the electron mobility does not increase when t2/t1≧1.14. Accordingly, it can be understood that a condition of t2/t1≧1.14 should be satisfied to maximize the current driving ability of the NMOS transistor by the dehydrogenation of the first interlayer dielectric layer.

Accordingly, a semiconductor device and methods of manufacturing the same according to embodiments of the invention may have one or more advantages.

For example, since tensile stress may be increased due to the dehydrogenation of a first interlayer dielectric layer formed on an NMOS transistor, it may be possible to improve the electron mobility and consequently the current driving ability of the NMOS transistor.

Furthermore, since the concentration of hydrogen ions in a first interlayer dielectric layer may be reduced due to the dehydrogenation, the effect of hot electron injection may be decreased. Therefore, the reliability of a gate dielectric layer of an NMOS transistor may be improved.

Since a capping layer may be formed on a first interlayer dielectric layer so that the concentration of hydrogen ions in a dehydrogenated first interlayer dielectric layer may not be subsequently increased, it may be possible to obstruct or hinder moisture and/or external ions from penetrating into the first interlayer dielectric layer. Therefore, the operational characteristics of an NMOS transistor may be improved.

Since the first interlayer dielectric layer may be dehydrogenated after contacts are formed in the first interlayer dielectric layer covering the NMOS and PMOS transistors, it may be possible to obstruct or hinder moisture and/or external ions from penetrating into the first interlayer dielectric layer during the formation of the contacts.

Since the capping layer may be formed in an in-situ process after contacts are formed in the first interlayer dielectric layer and the first interlayer dielectric layer is dehydrogenated, it may be possible to more effectively prevent the first interlayer dielectric layer from being hygroscopic.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of manufacturing a semiconductor device, comprising:
    forming an NMOS transistor on a substrate;
    forming a first interlayer dielectric layer on the NMOS transistor; and
    increasing a tensile stress in a channel region of the NMOS transistor by dehydrogenating the first interlayer dielectric layer.

2. The method of claim 1, wherein dehydrogenating the first interlayer dielectric layer increases a tensile stress of the first interlayer dielectric layer and increases a compressive stress in a source/drain region of the NMOS transistor.

3. The method of claim 1, wherein dehydrogenating the first interlayer dielectric layer comprises performing a plasma treatment, a UV treatment, and/or a thermal treatment on the first interlayer dielectric layer in a dehydrogenation gas atmosphere.

4. The method claim 3, wherein the dehydrogenation gas comprises $N_2$, $O_2$, $O_3$, $N_2O$, $H_2$, and/or $D_2$.

5. The method of claim 1, wherein the first interlayer dielectric layer has a tensile stress of at least about 200 MPa after dehydrogenization.

6. The method of claim 1, wherein the first interlayer dielectric layer comprises $O_3$-TEOS, USG, PSG, BSG, BPSG, FSG, SOG, and/or TOSZ.

7. The method of claim 1, further comprising forming contacts connected to the NMOS transistor in the first interlayer dielectric layer after forming the first interlayer dielectric layer.

8. The method of claim 1, further comprising forming a liner layer having a tensile stress directly on source/drain regions of the NMOS transistor before forming the first interlayer dielectric layer.

9. The method of claim 1, wherein:
    forming the NMOS transistor on the semiconductor substrate comprises forming the NMOS transistor and a PMOS transistor on the semiconductor substrate; and
    forming the first interlayer dielectric layer on the NMOS transistor comprises forming the first interlayer dielectric layer on the NMOS transistor and on the PMOS transistor.

10. The method of claim 9, further comprising implanting germanium and/or nitrogen ions into a portion of the first interlayer dielectric layer formed on the PMOS transistor after dehydrogenating the first interlayer dielectric layer.

11. The method of claim 9, further comprising forming a mask pattern on a portion of the first interlayer dielectric layer formed on the PMOS transistor before dehydrogenating the first interlayer dielectric layer.

12. A method of manufacturing a semiconductor device, comprising:
    forming an NMOS transistor on a substrate;
    forming a first interlayer dielectric layer on the NMOS transistor;
    dehydrogenating the first interlayer dielectric layer; and
    forming a second interlayer dielectric layer on the first interlayer dielectric layer after dehydrogenating the first interlayer dielectric layer, wherein the second interlayer dielectric layer has a stress smaller than a stress of the first interlayer dielectric layer after dehydrogenating the first interlayer dielectric layer.

13. The method of claim 1, further comprising forming a capping layer on the first interlayer dielectric layer after dehydrogenating the first interlayer dielectric layer, wherein the capping layer obstructs or hinders moisture and/or external ions from penetrating into the first interlayer dielectric layer.

14. The method of claim 13, wherein forming the capping layer comprises forming the capping layer in an in-situ process after dehydrogenating the first interlayer dielectric layer.

15. A method of manufacturing a semiconductor device, comprising:
forming an NMOS transistor on a substrate;
forming a first interlayer dielectric layer on the NMOS transistor;
dehydrogenating the first interlayer dielectric layer; and
forming a liner layer having a tensile stress on the NMOS transistor before forming the first interlayer dielectric layer;
wherein the NMOS transistor comprises a gate dielectric layer and a gate electrode, and wherein a total thickness of the gate dielectric layer, the gate electrode, and the liner layer of the NMOS transistor is represented by t1 and a total thickness of the liner layer and the first interlayer dielectric layer is represented by t2, and wherein $t2/t1 \geq 1.14$.

16. A method of manufacturing a semiconductor device, comprising:
forming an NMOS transistor on a substrate;
forming a first interlayer dielectric layer on the NMOS transistor;
dehydrogenating the first interlayer dielectric layer;
after dehydrogenating the first interlayer dielectric layer, forming an additional interlayer dielectric layer, which has a stress, on the first interlayer dielectric layer; and
dehydrogenating the additional interlayer dielectric layer;
wherein forming the additional interlayer dielectric layer and dehydrogenating the additional interlayer dielectric layer are repeated one or more times.

17. The method of claim 16, wherein dehydrogenating the additional interlayer dielectric layer comprises performing a plasma treatment, a UV treatment, and/or a thermal treatment on the additional interlayer dielectric layer in a dehydrogenation gas atmosphere.

18. The method of claim 17, further comprising forming a liner layer having a tensile stress on the NMOS transistor before forming the first interlayer dielectric layer.

19. The method of claim 18, wherein the NMOS transistor comprises a gate dielectric layer and a gate electrode, and wherein a total thickness of the gate dielectric layer, the gate electrode, and the liner layer of the NMOS transistor is represented by t1 and a total thickness of the liner layer, the dehydrogenated first interlayer dielectric layer, and the dehydrogenated additional interlayer dielectric layer is represented by t3, and wherein $t3/t1 \geq 1.14$.

20. A method of manufacturing a semiconductor device, comprising:
forming an NMOS transistor on a substrate;
forming a first interlayer dielectric layer, which includes an $O_3$-TEOS layer having a tensile stress, on the NMOS transistor; and
dehydrogenating the first interlayer dielectric layer.

21. The method of claim 20, wherein dehydrogenating the first interlayer dielectric layer comprises performing a plasma treatment, a UV treatment, and/or a thermal treatment on the first interlayer dielectric layer in a dehydrogenation gas atmosphere.

22. The method claim 21, wherein the dehydrogenation gas comprises $N_2$, $O_2$, $O_3$, $N_2O$, $H_2$, and/or $D_2$.

23. The method of claim 20, wherein the first interlayer dielectric layer has a tensile stress of 200 MPa or more following dehydrogenization.

24. The method of claim 20, further comprising, after forming the first interlayer dielectric layer, forming contacts connected to the NMOS transistor in the first interlayer dielectric layer.

25. The method of claim 20, wherein dehydrogenating the first interlayer dielectric layer comprises forming a dehydrogenated first interlayer dielectric layer, the method further comprising forming a second interlayer dielectric layer on the dehydrogenated first interlayer dielectric layer, wherein the second interlayer dielectric layer has a stress smaller than a stress of the dehydrogenated first interlayer dielectric layer.

26. The method of claim 20, wherein dehydrogenating the first interlayer dielectric layer comprises forming a dehydrogenated first interlayer dielectric layer, the method further comprising forming a capping layer on the dehydrogenated first interlayer dielectric layer, wherein the capping layer is configured to obstruct or hinder moisture and/or external ions from penetrating into the dehydrogenated first interlayer dielectric layer.

27. The method of claim 26, wherein forming the capping layer comprises forming the capping layer in an in-situ process after dehydrogenating the first interlayer dielectric layer.

28. The method of claim 20, further comprising, before forming the first interlayer dielectric layer, forming a liner layer having a tensile stress on the NMOS transistor.

29. The method of claim 27, wherein the NMOS transistor comprises a gate dielectric layer and a gate electrode, and wherein a total thickness of the gate dielectric layer, the gate electrode, and the liner layer of the NMOS transistor is represented by t1 and a total thickness of the liner layer and the dehydrogenated first interlayer dielectric layer is represented by t2, and wherein $t2/t1 \geq 1.14$.

30. The method of claim 20, wherein dehydrogenating the first interlayer dielectric layer comprises forming a dehydrogenated first interlayer dielectric layer, the method further comprising:
forming an additional interlayer dielectric layer having a tensile stress on the dehydrogenated first interlayer dielectric layer; and
dehydrogenating the additional interlayer dielectric layer;
wherein forming the additional interlayer dielectric layer and dehydrogenating the additional interlayer dielectric layer are repeated one or more times.

31. The method of claim 30, wherein dehydrogenating the additional interlayer dielectric layer comprises performing a plasma treatment, a UV treatment, and/or thermal treatment on the additional interlayer dielectric layer in a dehydrogenation gas atmosphere.

32. The method of claim 31, further comprising, before forming the first interlayer dielectric layer, forming a liner layer having a tensile stress on the NMOS transistor.

33. The method of claim 32, wherein the NMOS transistor comprises a gate dielectric layer and a gate electrode, wherein dehydrogenating the first interlayer dielectric layer comprises forming a dehydrogenated first interlayer dielectric layer, wherein dehydrogenating the additional interlayer dielectric layer comprises forming a dehydrogenated additional interlayer dielectric layer, and wherein a total thickness of the gate dielectric layer, the gate electrode, and the liner layer of the NMOS transistor is represented by t1 and a total thickness of the liner layer, the dehydrogenated first interlayer dielectric layer, and the dehydrogenated additional interlayer dielectric layer is represented by t3, and wherein $t3/t1 \geq 1.14$.

34. The method of claim 20, wherein:
forming the NMOS transistor on the semiconductor substrate comprises forming the NMOS transistor and a PMOS transistor on the semiconductor substrate; and forming the first interlayer dielectric layer on the NMOS transistor comprises forming the first interlayer dielectric layer on the NMOS transistor and the PMOS transistor.

35. The method of claim 34, further comprising implanting germanium and/or nitrogen ions into a portion of the first interlayer dielectric layer formed on the PMOS transistor after dehydrogenating the first interlayer dielectric layer.

36. The method of claim 34, further comprising forming a mask pattern on a portion of the first interlayer dielectric layer formed on the PMOS transistor before dehydrogenating the first interlayer dielectric layer.

* * * * *